(12) United States Patent
Sasagawa et al.

(10) Patent No.: US 9,773,915 B2
(45) Date of Patent: Sep. 26, 2017

(54) SEMICONDUCTOR DEVICE AND MANUFACTURING METHOD THEREOF

(71) Applicant: SEMICONDUCTOR ENERGY LABORATORY CO., LTD., Atsugi-shi, Kanagawa-ken (JP)

(72) Inventors: Shinya Sasagawa, Kanagawa (JP); Motomu Kurata, Kanagawa (JP); Kazuya Hanaoka, Kanagawa (JP); Suguru Hondo, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/293,115

(22) Filed: Jun. 2, 2014

(65) Prior Publication Data
US 2014/0361291 A1 Dec. 11, 2014

(30) Foreign Application Priority Data
Jun. 11, 2013 (JP) .................................. 2013-123013

(51) Int. Cl.
 *H01L 29/786* (2006.01)
 *H01L 29/66* (2006.01)
(52) U.S. Cl.
 CPC .... *H01L 29/7869* (2013.01); *H01L 29/66969* (2013.01); *H01L 29/78606* (2013.01); *H01L 29/78609* (2013.01)
(58) Field of Classification Search
 CPC ............. H01L 29/786; H01L 21/02554; H01L 29/66969; H01L 27/1225; H01L 21/0255; H01L 29/7869
 See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Tucker J Wright
(74) *Attorney, Agent, or Firm* — Nixon Peabody LLP; Jeffrey L. Costellia

(57) ABSTRACT

A semiconductor device using oxide semiconductor with favorable electrical characteristics, or a highly reliable semiconductor device is provided. A semiconductor device is manufactured by: forming an oxide semiconductor layer over an insulating surface; forming source and drain electrodes over the oxide semiconductor layer; forming an insulating film and a conductive film in this order over the oxide semiconductor layer and the source and drain electrodes; etching part of the conductive film and insulating film to form a gate electrode and a gate insulating layer, and etching part of the upper portions of the source and drain electrodes to form a first covering layer containing a constituent element of the source and drain electrodes and in contact with the side surface of the gate insulating layer; oxidizing the first covering layer to form a second covering layer; and forming a protective insulating layer containing an oxide over the second covering layer.

19 Claims, 12 Drawing Sheets

(56) References Cited

U.S. PATENT DOCUMENTS

| | | | |
|---|---|---|---|
| 6,162,738 A * | 12/2000 | Chen et al. | 438/745 |
| 6,277,679 B1 * | 8/2001 | Ohtani | 438/151 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0209486 A1 * | 10/2004 | Naeem et al. | 438/786 |
| 2005/0017302 A1 | 1/2005 | Hoffman | |
| 2005/0026085 A1 * | 2/2005 | Myung | 430/311 |
| 2005/0199959 A1 | 9/2005 | Chiang et al. | |
| 2006/0011577 A1 * | 1/2006 | Chiu et al. | 216/58 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 * | 8/2007 | Hosono et al. | 257/347 |
| 2007/0235805 A1 * | 10/2007 | Yan | 257/347 |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0026564 A1 * | 1/2008 | Frohberg et al. | 438/637 |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0076214 A1 * | 3/2008 | Han et al. | 438/197 |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0181565 A1 * | 7/2010 | Sakata et al. | 257/43 |
| 2011/0081753 A1 * | 4/2011 | Yamanari et al. | 438/216 |
| 2011/0240998 A1 * | 10/2011 | Morosawa et al. | 257/57 |
| 2012/0132903 A1 * | 5/2012 | Yamazaki et al. | 257/43 |
| 2012/0138972 A1 * | 6/2012 | Li et al. | 257/88 |
| 2012/0315730 A1 * | 12/2012 | Koezuka et al. | 438/158 |
| 2013/0140554 A1 | 6/2013 | Yamazaki et al. | |
| 2013/0161605 A1 | 6/2013 | Sasagawa et al. | |
| 2013/0161621 A1 | 6/2013 | Isobe et al. | |
| 2013/0187151 A1 | 7/2013 | Yamazaki | |
| 2013/0187161 A1 | 7/2013 | Yamazaki | |
| 2014/0042428 A1 * | 2/2014 | Ning et al. | 257/43 |
| 2014/0103346 A1 | 4/2014 | Yamazaki | |
| 2014/0106504 A1 | 4/2014 | Yamazaki et al. | |
| 2014/0183529 A1 | 7/2014 | Yamazaki et al. | |
| 2014/0209898 A1 | 7/2014 | Yamamoto et al. | |
| 2014/0264323 A1 | 9/2014 | Sasagawa et al. | |
| 2014/0284595 A1 | 9/2014 | Sasagawa et al. | |
| 2014/0326994 A1 | 11/2014 | Tanaka | |
| 2014/0339546 A1 | 11/2014 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID

(56) References Cited

OTHER PUBLICATIONS

International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transistion: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In≠Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Material), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al. "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 ; SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical. Review. 8), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID DIgest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner 101 106 103 151 102 152 105 104 110 107

101 106 104 151 102 152 110 107 105

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

In this specification and the like, the term "semiconductor device" means any kind of device that can function by utilizing semiconductor characteristics; and a transistor, a semiconductor circuit, an arithmetic device, a memory device, an imaging device, an electro-optical device, a power generation device (e.g., a thin film solar cell and an organic thin film solar cell) and an electronic device are each one embodiment of semiconductor devices.

2. Description of the Related Art

A technique by which transistors are formed using semiconductor thin films formed over a substrate having an insulating surface has been attracting attention. The transistor is applied to a wide range of electronic devices such as an integrated circuit (IC) or an image display device (also simply referred to as a display device). As semiconductor thin films that can be used for transistors, silicon-based semiconductor materials have been widely known, but oxide semiconductors have been attracting attention as alternative materials.

For example, a technique for manufacturing a transistor using zinc oxide or an In—Ga—Zn-based oxide semiconductor as an oxide semiconductor is disclosed (see Patent Documents 1 and 2).

In recent years, demand for integrated circuits in which semiconductor elements such as miniaturized transistors are integrated with high density has risen with increased performance and reduction in the size or weight of electronic devices.

REFERENCE

Patent Document

[Patent Document 1] Japanese Published Patent Application No. 2007-123861
[Patent Document 2] Japanese Published Patent Application No. 2007-96055

SUMMARY OF THE INVENTION

An object of one embodiment of the present invention is to obtain a semiconductor device using an oxide semiconductor, which has favorable electrical characteristics.

Another object of one embodiment of the present invention is to provide a highly reliable semiconductor device which uses an oxide semiconductor and in which a change in the electrical characteristics is suppressed.

Another object of one embodiment of the present invention is to provide a semiconductor device that is suitable for miniaturization.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a method for manufacturing a semiconductor device, including the steps of forming an oxide semiconductor layer over an insulating surface; forming a source electrode and a drain electrode over the oxide semiconductor layer; forming an insulating film and a conductive film in this order over the oxide semiconductor layer, the source electrode, and the drain electrode; etching part of the conductive film and part of the insulating film to form a gate electrode and a gate insulating layer, and etching part of an upper portion of the source electrode and part of an upper portion of the drain electrode to form a first covering layer, which contains a constituent element of the source and drain electrodes and is in contact with a side surface of the gate insulating layer; oxidizing the first covering layer to form a second covering layer; and forming a protective insulating layer containing an oxide over the second covering layer.

Another embodiment of the present invention is a method for manufacturing a semiconductor device, including the steps of forming an oxide semiconductor layer over an insulating surface; forming a source electrode and a drain electrode over the oxide semiconductor layer; forming an insulating film and a conductive film in this order over the oxide semiconductor layer, the source electrode, and the drain electrode; etching part of the conductive film and part of the insulating film to form a gate electrode and a gate insulating layer, and etching part of an upper portion of the source electrode and part of an upper portion of the drain electrode to form a first covering layer, which contains a constituent element of the source and drain electrodes and is in contact with a side surface of the gate insulating layer; and forming a protective insulating layer containing an oxide over the first covering layer in an oxygen-containing atmosphere, and oxidizing the first covering layer to form a second covering layer.

Another embodiment of the present invention is a method for manufacturing a semiconductor device, including the steps of forming a first oxide layer and an oxide semiconductor layer in this order over an insulating surface; forming a source electrode and a drain electrode over the oxide semiconductor layer; forming an oxide film, an insulating film, and a conductive film in this order over the oxide semiconductor layer, the source electrode, and the drain electrode; etching part of the conductive film, part of the insulating film and part of the oxide film to form a gate electrode, a gate insulating layer, and a second oxide layer, and etching part of an upper portion of the source electrode and part of an upper portion of the drain electrode to form a first covering layer, which contains a constituent element of the source and drain electrodes and is in contact with a side surface of the gate insulating layer and a side surface of the second oxide layer; oxidizing the first covering layer to form a second covering layer; and forming a protective insulating layer containing an oxide over the second covering layer.

Another embodiment of the present invention is a method for manufacturing a semiconductor device, including the steps of forming a first oxide layer and an oxide semiconductor layer in this order over an insulating surface; forming a source electrode and a drain electrode over the oxide semiconductor layer; forming an oxide film, an insulating film, and a conductive film in this order over the oxide semiconductor layer, the source electrode, and the drain electrode; etching part of the conductive film, part of the insulating film and part of the oxide film to form a gate electrode, a gate insulating layer and a second oxide layer, and etching part of an upper portion of the source electrode and part of an upper portion of the drain electrode to form a first covering layer, which contains a constituent element of the source and drain electrodes and is in contact with a side surface of the gate insulating layer and a side surface of the second oxide layer; forming a protective insulating layer containing an oxide over the first covering layer in an oxygen-containing atmosphere, and oxidizing the first covering layer to form a second covering layer.

Another embodiment of the present invention is a semiconductor device including an oxide semiconductor layer over an insulating surface, a source electrode and a drain electrode over the oxide semiconductor layer, a gate insulating layer over the oxide semiconductor layer, a gate electrode over the gate insulating layer, a covering layer containing an oxide containing a constituent element of the source and drain electrodes and being in contact with a side surface of the gate insulating layer, and a protective insulating layer covering the covering layer and containing an oxide. A top-view shape of the gate electrode and a top-view shape of the gate insulating layer are substantially the same.

Another embodiment of the present invention is a semiconductor device including a first oxide layer over an insulating surface, an oxide semiconductor layer over the first oxide layer, a second oxide layer over the oxide semiconductor layer, a source electrode and a drain electrode over the second oxide layer, a gate insulating layer over the second oxide layer, a gate electrode over the gate insulating layer, a covering layer containing an oxide containing a constituent element of the source and drain electrodes and being in contact with a side surface of the gate insulating layer, and a protective insulating layer covering the covering layer and containing an oxide. A top-view shape of the gate electrode and a top-view shape of the gate insulating layer are substantially the same.

Another embodiment of the present invention is a semiconductor device including a first oxide layer over an insulating surface, an oxide semiconductor layer over the first oxide layer, a source electrode and a drain electrode over the oxide semiconductor layer, a second oxide layer over the oxide semiconductor layer, a gate insulating layer over the second oxide layer, a gate electrode over the gate insulating layer, a covering layer containing an oxide containing a constituent element of the source and drain electrodes and being in contact with a side surface of the gate insulating layer and a side surface of the second oxide layer, and a protective insulating layer covering the covering layer and containing an oxide. A top-view shape of the gate electrode, a top-view shape of the gate insulating layer, and a top-view shape of the second oxide layer are substantially the same.

The protective insulating layer of the above semiconductor device preferably contains an aluminum oxide.

The constituent element in the above semiconductor device preferably is aluminum, titanium, chromium, nickel, copper, yttrium, zirconium, molybdenum, silver, tantalum, or tungsten.

Note that in this specification and the like, the expression "top-view shapes (of two or more layers) are substantially the same" means that outlines of stacked two or more layers at least partly overlap with each other. For example, what is expressed by the expression includes an upper layer and a lower layer that are processed with the use of the same mask pattern or partly processed with the use of the same mask pattern. In some cases, however, the outlines of such upper and lower layers do not completely overlap with each other; for example, the edge of the upper layer may be on an inner/outer side than the edge of the lower layer. The expression "top-view shapes (of two or more layers) are substantially the same" may also apply to such cases.

One embodiment of the present invention makes it possible to provide a semiconductor device having favorable electrical characteristics. Further, one embodiment of the present invention makes it possible to provide a highly reliable semiconductor device in which a change in the electrical characteristics is suppressed. Further, one embodiment of the present invention makes it possible to provide a semiconductor device that is suitable for miniaturization.

DETAILED DESCRIPTION OF THE INVENTION

Figure 1A:
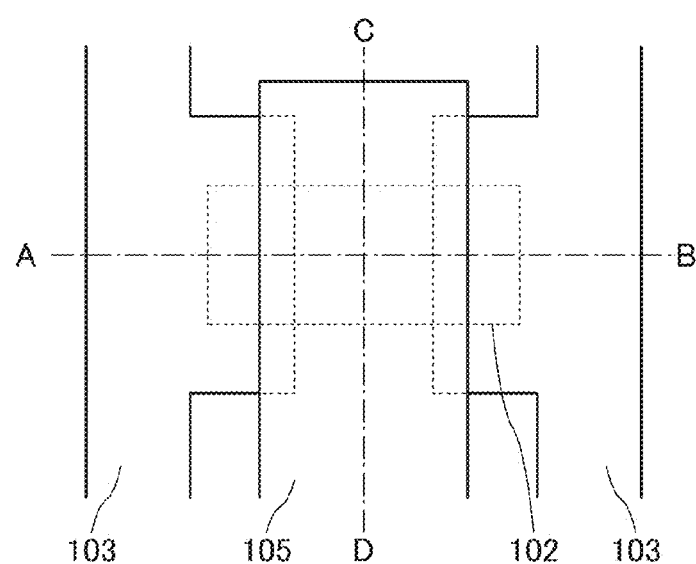
FIGS. 1A to 1C illustrate a structural example of a semiconductor device of an embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is used to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Embodiment 1

In this embodiment, a structural example of a transistor as a semiconductor device of one embodiment of the present invention, and an example of a method for manufacturing the transistor are described with reference to drawings.

In a manufacturing process of a semiconductor device, sometimes two or more films are processed with the use of the same etching mask. For example, a stacked-layer film including an insulating film and a conductive film thereon is formed, and then the conductive film and the insulating film are successively etched in some cases.

In the case where there is a layer containing a conductive material (such layer is also referred to as a conductive layer) under the stacked-layer film, the conductive material of the conductive layer attaches to the side surface of the processed insulating film by etching, which may lead to an electrical short circuit between the conductive film in the upper part of the stacked-layer film and the conductive layer under the stacked-layer film via the attached substance. Therefore, in order to avoid the short circuit, the attached substance needs to be removed after etching, with the use of an etchant such as an acid.

However, sometimes the insulating film and the conductive film are etched by the etchant for removing the attached substance. When the insulating film is etched, for example, the edge of the insulating film is on an inner side than the edge of the conductive film thereon, that is, a so-called undercut occurs. In that case, when a thin film is further formed on the stacked-layer film, coverage with the thin film may deteriorate. Furthermore, when the conductive film is etched, an electrode or a wiring to be obtained by processing the conductive film changes in thickness and width. As a result, electrical characteristics of a semiconductor device having such electrode or wiring become different from designed values, which causes variations in electrical characteristics. For a miniaturized semiconductor device, in particular, a conductive film needs to be processed minutely and the conductive film is often extremely thin. Thus, variations in electrical characteristics become notable.

In view of the above, in a manufacturing method of a semiconductor device of one embodiment of the present invention, the above-described problem can be solved not by removing the conductive substance attached to the side surface of the insulating film after etching but by oxidizing the attached substance.

The attached substance can be oxidized by a thermal oxidation treatment, oxygen plasma treatment, a treatment with a solution having strong oxidizing power, such as ozone water, or the like.

It is preferable to form a thin film containing an oxide in an oxygen-containing atmosphere with the attached substance attached to the insulating film, and perform an oxidation treatment of the attached substance in parallel with the film formation.

More specifically, a semiconductor device can be manufactured by the following method, for example. First, a structural example of a transistor that can be manufactured by a manufacturing method of a semiconductor device of one embodiment of the present invention will be described.

Structural Example

Figure 1B:
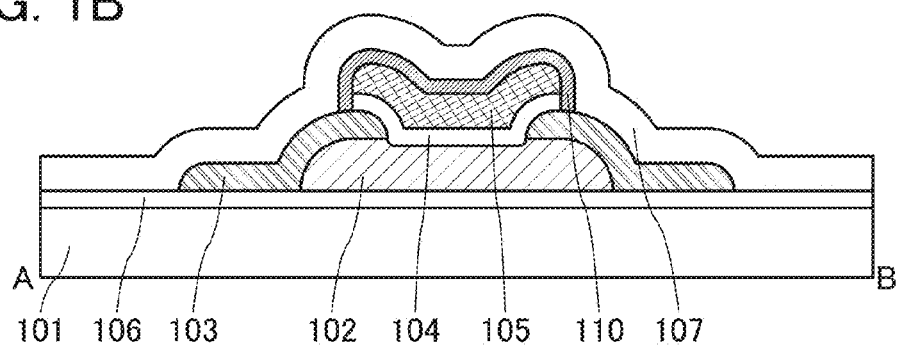
Figure 1C:
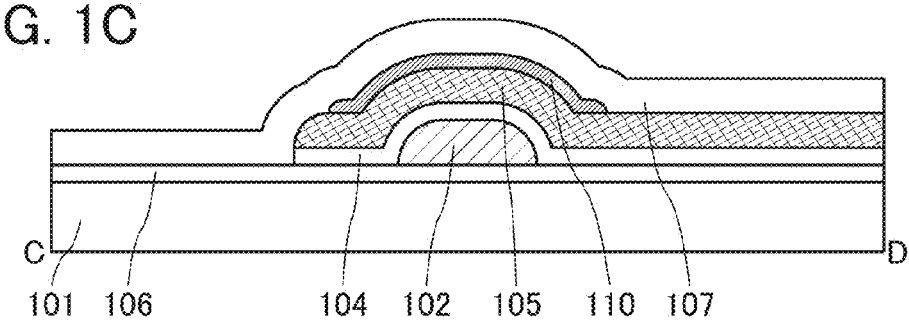

FIG. 1A is a schematic top view of a transistor 100 described in this structural example. FIGS. 1B and 1C are schematic cross-sectional views taken along line A-B and line C-D in FIG. 1A, respectively. Note that some components are not illustrated in FIG. 1A for simplicity.

A transistor 100 is provided over a substrate 101 and includes an island-shaped semiconductor layer 102, a pair of electrodes 103 that partly overlaps with the semiconductor layer 102, a gate electrode 105 that overlaps with the semiconductor layer 102, and a gate insulating layer 104 provided between the semiconductor layer 102 and the gate electrode 105.

The gate electrode 105 and the gate insulating layer 104 are provided such that their top-view shapes are substantially the same. Further, a covering layer 110 that covers part of the gate electrode 105 and the side surface of the gate insulating layer 104 is provided. The covering layer 110 is provided to cover the side surface of the gate insulating layer 104 at least in regions overlapping with the pair of electrodes 103.

An insulating layer 106 is provided to cover a top surface of the substrate 101. The insulating layer 106 is provided in contact with an undersurface of the semiconductor layer 102.

An insulating layer 107 is provided to cover the transistor 100. Specifically, the insulating layer 107 is provided over the gate insulating layer 104, the pair of electrodes 103, the gate electrode 105, and the covering layer 110.

The semiconductor layer 102 preferably contains an oxide semiconductor. Further, the semiconductor layer 102 preferably contains at least indium (In) or zinc (Zn). The semiconductor layer 102 more preferably contains an In-M-Zn-based oxide (M is a metal such as Al, Ti, Ga, Ge, Y, Zr, Sn, La, Ce, or Hf).

One of the pair of electrodes 103 serves as a source electrode of the transistor 100 and the other serves as a drain electrode of the transistor 100.

The pair of electrodes 103 preferably contains a conductive material such as aluminum, titanium, chromium, nickel, copper, yttrium, zirconium, molybdenum, silver, tantalum, or tungsten, for example. Alternatively, the pair of electrodes 103 may contain a nitride of these conductive materials. The use of W or Ti with relatively high melting point is preferable for the reason that the upper limit of the temperature in the manufacturing process of the transistor 100 can be raised.

The covering layer 110 contains an oxide containing a constituent element of the pair of electrodes 103. For example, the covering layer 110 contains an oxide of the above-mentioned conductive materials.

Besides, the covering layer 110 may contain an element (e.g., carbon) constituting a resist mask used in etching of the gate electrode 105 and gate insulating layer 104, or a gas (e.g., fluorine, chlorine, or a rare gas such as argon) used in etching.

As shown in FIG. 1B, the covering layer 110 is preferably provided to cover the side surface of the gate insulating layer 104 and to be in contact with part of the pair of electrodes 103 and part of the gate electrode 105. Therefore, it is preferable that the covering layer 110 have an insulating property or high enough resistance not to adversely affect the operation of the transistor 100.

The insulating layer 107 preferably contains a material having a barrier property against hydrogen and water. In addition, the insulating layer 107 preferably contains a material which is relatively impermeable to oxygen so that oxygen in the semiconductor layer 102 is prevented from being released to the outside.

In addition, in the case where oxidation of the covering layer 110 and formation of the insulating layer 107 are performed by the same process as described later, it is preferable that a material containing an oxide be used for the insulating layer 107.

As the material that can be used for the insulating layer 107, an insulating material such as silicon nitride, silicon nitride oxide, aluminum oxide, aluminum oxynitride, gallium oxide, gallium oxynitride, yttrium oxide, yttrium oxynitride, hafnium oxide, or hafnium oxynitride can be used. Aluminum oxide or aluminum oxynitride is particularly preferable because it is an oxide having a high barrier property against hydrogen and oxygen.

A second gate electrode which faces the gate electrode 105 with the semiconductor layer 102 interposed therebetween may be provided under the semiconductor layer 102 (i.e., somewhere between the semiconductor layer 102 and the substrate 101). In the case where the second gate electrode is provided between the substrate 101 and the insulating layer 106, for example, the insulating layer 106 serves as a second gate insulating layer. In the case where the second gate electrode is provided, it is preferable that a thick insulating film be formed after the second gate electrode is formed, and then a planarization treatment be performed so that the top surface of the second gate electrode is exposed.

By providing the transistor 100 with two gate electrodes, its threshold voltage can be controlled. Further, by applying the same potential to the two gate electrodes, on-state current of the transistor 100 can be increased.

<Components>

Components of the transistor 100 are described below.

<Semiconductor Layer>

As a semiconductor that can be used for a semiconductor layer in which a channel of a transistor is formed, for example, a semiconductor material such as silicon or germanium, a compound semiconductor material, an organic semiconductor material, or an oxide semiconductor material may be used.

Further, there is no particular limitation on the crystallinity of a semiconductor used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of transistor characteristics can be reduced.

For example, in the case of where silicon is used as the semiconductor, amorphous silicon, microcrystalline silicon, polycrystalline silicon, single crystal silicon, or the like can be used.

Using an oxide semiconductor as a semiconductor contained in the semiconductor layer 102 is particularly preferable. An oxide semiconductor having a wider band gap and a lower carrier density than silicon is preferably used because off-state leakage current of the transistor can be reduced. A case in which an oxide semiconductor is used for the semiconductor layer 102 is described below.

As the semiconductor layer 102, it is particularly preferable to use a layer including a plurality of crystal parts whose c-axes are aligned perpendicular to a surface on which the semiconductor layer 102 is formed (i.e., the top surface of the insulating layer 106) or the top surface of the semiconductor layer 102 and in which the adjacent crystal parts have no grain boundary.

The use of such materials for the semiconductor layer 102 makes it possible to provide a highly reliable transistor 100 in which a change in the electrical characteristics is suppressed.

Note that details of a preferable mode and a forming method of an oxide semiconductor that can be used for the semiconductor layer 102 will be described later in an embodiment.

Hereinafter, a semiconductor layer that contains an oxide semiconductor may be referred to as an oxide semiconductor layer.

<Substrate>

There is no particular limitation on the property of a material and the like of the substrate 101 as long as the material has heat resistance high enough to withstand at least heat treatment in the process. For example, a glass substrate, a ceramic substrate, a quartz substrate, a sapphire substrate, or an yttria-stabilized zirconia (YSZ) substrate may be used as the substrate 101. Alternatively, a single crystal semiconductor substrate or a polycrystalline semiconductor substrate made of silicon or silicon carbide, a compound semiconductor substrate made of silicon germanium or the like, an SOI substrate, or the like can be used.

Still alternatively, any of the above-described semiconductor substrates or the SOI substrate provided with a semiconductor element may be used as the substrate 101. In this case, the transistor 100 is formed over the substrate 101 with an interlayer insulating layer provided therebetween. The transistor 100 in this case may have a structure in which at least one of the gate electrode 105 and the pair of electrodes 103 is electrically connected to the above semiconductor element by a connection electrode embedded in the interlayer insulating layer. The transistor 100 is provided over the semiconductor element with the interlayer insulating layer provided therebetween, which can suppress an increase in area due to provision of the transistor 100.

<Gate Electrode>

The gate electrode 105 can be formed using a metal selected from aluminum, chromium, copper, tantalum, titanium, molybdenum, and tungsten; an alloy containing any of these metals as a component; an alloy containing any of these metals in combination; or the like. Manganese or zirconium may be used as the metal. Alternatively, a semiconductor typified by polycrystalline silicon doped with an impurity element such as phosphorus, or a silicide such as nickel silicide may be used. Furthermore, the gate electrode 105 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film containing aluminum and one or more metals selected from titanium, tantalum, tungsten, molybdenum, chromium, neodymium, and scandium; or a nitride film of the alloy film may be used.

<Gate Insulating Layer>

The gate insulating layer 104 can be formed to have a single-layer structure or a stacked-layer structure using, for example, one or more of silicon oxide, silicon oxynitride, silicon nitride oxide, aluminum oxide, hafnium oxide, gallium oxide, Ga—Zn-based metal oxide, silicon nitride, and the like.

Alternatively, the gate insulating layer 104 may be formed using a high-k material such as hafnium silicate (HfSiO$_x$), hafnium silicate to which nitrogen is added (HfSi$_x$O$_y$N$_z$), hafnium aluminate to which nitrogen is added (HfAlO$_y$N$_z$), hafnium oxide, or yttrium oxide, in which case gate leakage current of the transistor can be reduced.

<Pair of Electrodes>

The pair of electrodes 103 can be formed as a single-layer structure or a stacked-layer structure using a single metal of the above-described materials or an alloy containing any of these metals as a main component. Alternatively, a nitride of the above metals or the above alloy may be used.

For example, a single-layer structure of an aluminum film containing silicon; a two-layer structure in which a titanium film is stacked over an aluminum film; a two-layer structure in which a titanium film is stacked over a tungsten film; a two-layer structure in which a copper film is formed over a copper-magnesium-aluminum alloy film; a three-layer structure in which a titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; and the like can be given.

<Insulating Layer>

The insulating layer 106 serves as a barrier layer that prevents diffusion of impurities contained in the substrate 101.

The insulating layer 106 is preferably an oxide insulating film containing oxygen at a higher proportion than oxygen in the stoichiometric composition. Such an oxide insulating film releases part of the oxygen upon heating. For example, it is preferable to use an oxide insulating film in which the amount of released oxygen when converted into oxygen atoms is $1.0 \times 10^{18}$ atoms/cm$^3$ or more, preferably $3.0 \times 10^{20}$ atoms/cm$^3$ or more, in thermal desorption spectroscopy (TDS) analysis. Note that the substrate temperature in the TDS analysis is preferably higher than or equal to 100° C. and lower than or equal to 700° C., or higher than or equal to 100° C. and lower than or equal to 500° C.

As the insulating layer 106, for example, silicon oxide, silicon oxynitride, or the like can be used.

By providing the insulating layer 106 in contact with the semiconductor layer 102, oxygen released from the insulating layer 106 by the heating in the manufacturing process is supplied to the semiconductor layer 102, and an oxygen vacancy in the semiconductor layer 102 is filled. Consequently, a highly reliable transistor 100 in which a change in electrical characteristics is suppressed can be obtained.

The insulating layer 107 may have a stacked-layer structure including two or more layers, in which an insulating film containing an oxide similar to that of the insulating layer 106 is provided on the semiconductor layer 102 side and an insulating film having a barrier property against oxygen and hydrogen is provided thereon. With this structure, oxygen can also be supplied from the insulating layer 107 to the semiconductor layer 102.

The above is the description of the structural example of the transistor 100.

<Example of Manufacturing Method>

An example of a manufacturing method of the transistor 100 shown in FIGS. 1A to 1C is described below with reference to the drawings. FIGS. 2A to 2E are schematic cross-sectional views each showing a step of the manufacturing method described below as an example.

<Formation of Insulating Layer>

First, the insulating layer 106 is formed over the substrate 101.

The insulating layer 106 is formed by a sputtering method, a chemical vapor deposition (CVD) method, an evaporation method, or the like.

In order to make the insulating layer 106 excessively contain oxygen, the insulating layer 106 may be formed in an oxygen atmosphere, for example. Alternatively, the insulating layer 106 may excessively contain oxygen in such a manner that oxygen is introduced into the insulating layer 106 that has been formed. Both the methods may be combined.

For example, oxygen (at least including any of oxygen radicals, oxygen atoms, and oxygen ions) is introduced into the insulating layer 106 which has been formed, whereby a region excessively containing oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, dinitrogen monoxide, nitrogen dioxide, carbon dioxide, carbon monoxide, and the like can be used. Further, a rare gas may be included in the gas containing oxygen for the oxygen introduction treatment.

<Formation of Semiconductor Layer>

Figure 2A:
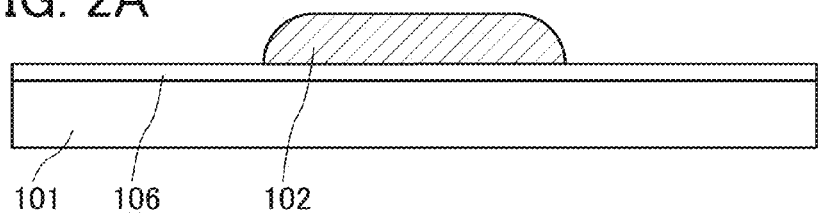
FIGS. 2A to 2E illustrate an example of a method for manufacturing a semiconductor device of an embodiment.

Next, a semiconductor film is formed over the insulating layer 106. A resist mask is formed over the semiconductor film by photolithography or the like, an unnecessary portion of the semiconductor film is removed by etching, and then the resist mask is removed. Thus, the island-shaped semiconductor layer 102 can be formed (FIG. 2A).

The semiconductor film can be formed by a sputtering method, a CVD method, a molecular beam epitaxy (MBE) method, an atomic layer deposition (ALD) method, a pulsed laser deposition (PLD) method, or the like. Alternatively, a technique for formation of a thin film using a liquid material, such as a sol-gel method, a spray method, or a mist method, can be used. The semiconductor film is preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

A heat treatment may be performed after the formation of the semiconductor film. The heat treatment may be performed at 250° C. or higher and 650° C. or lower, preferably 300° C. or higher and 500° C. or lower, in an inert gas atmosphere, in an atmosphere containing an oxidizing gas at 10 ppm or more, or under reduced pressure. Alternatively, the heat treatment may be performed in such a manner that heat treatment is performed in an inert gas atmosphere, and then another heat treatment is performed in an atmosphere containing an oxidization gas at 10 ppm or more, in order to compensate desorbed oxygen. By the heat treatment, oxygen is supplied from the insulating layer 106 to the semiconductor film (or the semiconductor layer 102), which enables a reduction in oxygen vacancies in the oxide semiconductor included in the semiconductor layer 102. The heat treatment may be performed directly after the formation of the semiconductor film or may be performed after the semiconductor film is processed into the island-shaped semiconductor layer 102.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use extreme ultra-violet light (EUV), X-rays, or an electron beam because extremely minute processing can be performed. In the case of performing exposure by scanning with a beam such as an electron beam, a photomask is not needed.

An organic resin film having a function of improving adhesion between the film to be processed (here, the semiconductor film) and a resist film may be formed before the resist film serving as a resist mask is formed. The organic resin film can be formed by a spin-coating method or the like, for example, to cover the unevenness thereunder, thereby reducing variations in thickness of the resist mask to be provided over the organic resin film. In a particularly minute process, the organic resin film is preferably formed using a material functioning as an anti-reflection film against light for exposure. Examples of such an organic resin film serving as an anti-reflection film include bottom anti-reflection coating (BARC) film. The organic resin film may be removed at the same time as the removal of the resist mask or after the resist mask is removed.

<Formation of Pair of Electrodes>

Next, a conductive film is formed over the insulating layer 106 and the semiconductor layer 102. A resist mask is formed over the conductive film by photolithography or the like, an unnecessary portion of the conductive film is removed by etching, and then the resist mask is removed. In this manner, the pair of electrodes 103 can be formed (FIG. 2B).

The conductive film can be formed by a sputtering method, an evaporation method, a CVD method, or the like.

Figure 2B:
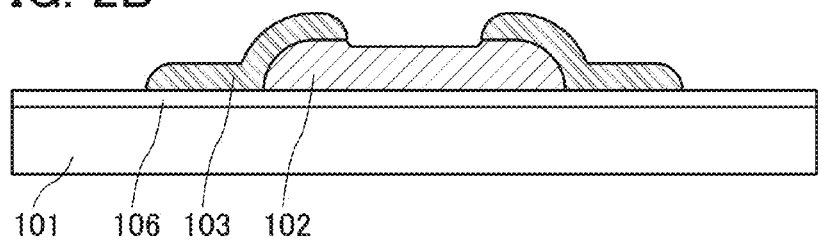

Here, as illustrated in FIG. 2B, in some cases, part of the upper portion of the semiconductor layer 102 is etched in the etching of the conductive film to reduce the thickness of a portion where the pair of electrodes 103 does not overlap with the semiconductor layer 102. For this reason, the semiconductor film serving as the semiconductor layer 102 is preferably formed to have a large thickness in advance in consideration of the thickness to be etched.

<Formation of Gate Insulating Layer and Gate Electrode>

Figure 2C:
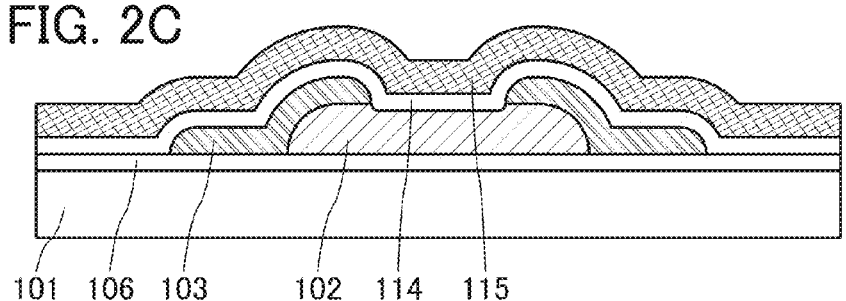

Next, an insulating film 114 is formed over the semiconductor layer 102, the pair of electrodes 103, and the insulating layer 106. Then, a conductive film 115 is formed over the insulating film 114 (FIG. 2C).

The insulating film 114 later serves as the gate insulating layer 104. The insulating film 114 can be formed by a sputtering method, a CVD method, an MBE method, an ALD method, a PLD method, or the like. In particular, it is preferable that the insulating film be formed by a CVD method, more preferably a plasma CVD method because coverage can be improved.

The conductive film 115 later serves as the gate electrode 105. The conductive film 115 can be formed by a sputtering method, an evaporation method, a CVD method, or the like, for example.

Next, a resist mask is formed over the conductive film 115 by photolithography or the like. Unnecessary portions of the conductive film 115 and insulating film 114 are removed by etching in this order, and then the resist mask is removed. In this manner, the gate electrode 105 and the gate insulating layer 104 can be formed. Here, etching is preferably performed by dry etching.

Note that the resist mask may be removed after the gate electrode 105 is formed by etching the conductive film 115, and the gate insulating layer 104 may be etched with the use of the gate electrode 105 as a hard mask.

Figure 2D:
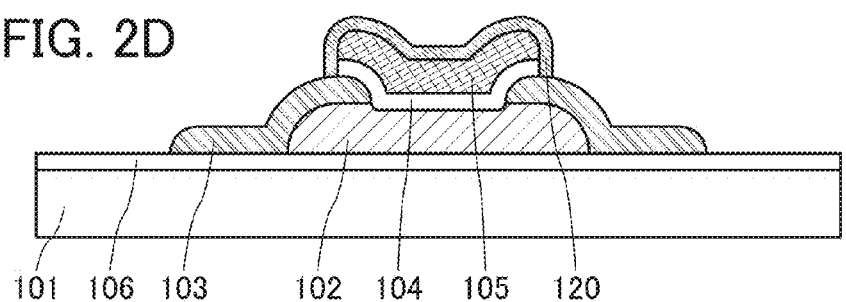

When the insulating film 114 is etched by dry etching and processed into the gate insulating layer 104, a reaction product of the exposed pair of electrodes 103 attaches to the side surface of the gate insulating layer 104 and the side and top surfaces of the gate electrode 105, whereby a covering layer 120 (also referred to as a first covering layer) is formed (FIG. 2D).

Since the covering layer 120 contains the reaction product of the pair of electrodes 103, it contains a constituent element of the pair of electrodes 103. Besides, the covering layer 120 may contain a constituent element (e.g., silicon) of the gate insulating layer 104 or a constituent element (e.g., carbon, fluorine, or chlorine) of the resist mask, a gas used for dry etching, or the like.

In the drawing, the covering layer 120 is shown as having a uniform thickness in a direction perpendicular to the surface on which the covering layer 120 is formed. However, in some cases, the thickness of the covering layer 120 gets greater as it is close to the pair of electrodes 103 and smaller as it is far from the pair of electrodes 103. Depending on the size of the gate electrode 105, the covering layer 120 is not formed on the top surface of the gate electrode sometimes. Note that the covering layer 120 may have conductivity at this stage.

<Oxidation Treatment of Covering Layer>

Next, the covering layer 120 is oxidized to form the covering layer 110 containing an oxide containing the constituent element of the pair of electrodes 103.

As the oxidation treatment, a thermal oxidization treatment, an oxygen plasma treatment, or a treatment with a solution having strong oxidizability such as ozone water may be performed.

By oxidizing the covering layer 120, the covering layer 110 can be insulated or have extremely high resistance. Accordingly, an electrical short circuit between the pair of electrodes 103 and the gate electrode 105 can be prevented.

The obtained covering layer 110 covers the side surface of the gate insulating layer 104 and part of the side surface of the gate electrode 105 at least over the pair of electrodes 103. Therefore, steps at the edges of the gate electrode 105 and gate insulating layer 104 become smooth and the coverage with the insulating layer 107 to be formed later can be improved. Accordingly, disconnection of the insulating layer 107 or formation of a low-density region (also referred to as a cavity) at such steps can be prevented, so that deterioration of a barrier property of the insulating layer 107 can be suppressed.

Here, if the covering layer 120 is removed by an etchant, the side surface of the gate insulating layer 104 is also etched and the edge of the gate insulating layer 104 is positioned on an inner side than the edge of the gate electrode 105, that is, a so-called undercut occurs. Therefore, the coverage with the insulating layer 107 to be formed later deteriorates, and problems such as disconnection of the insulating layer 107 or formation of a cavity in the insulating layer 107 are caused.

However, according to this manufacturing method, the covering layer 120 is oxidized to form the covering layer 110 which is insulated or has high resistance. In this way, even if the covering layer 120 has conductivity, an electrical short circuit between the gate electrode 105 and the pair of electrodes 103 can be prevented without removing the covering layer 120.

<Formation of Insulating Layer>

Figure 2E:
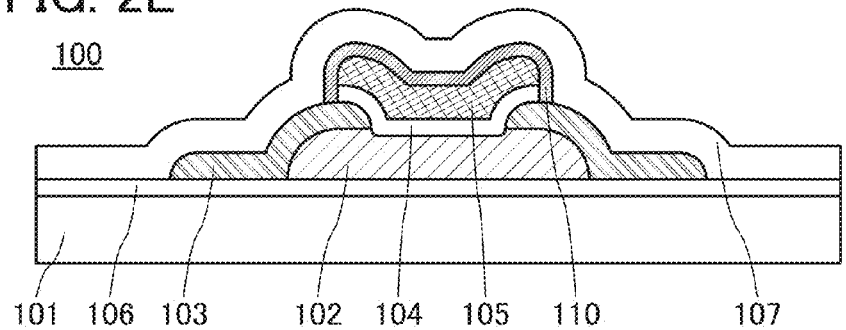

Next, the insulating layer 107 is formed over the pair of electrodes 103, the gate electrode 105, the gate insulating layer 104, and the covering layer 110 (FIG. 2E).

The insulating layer 107 can be formed by a sputtering method, a CVD method, an MBE method, an ALD method, a PLD method, or the like. In particular, the insulating layer 107 is preferably formed by a CVD method, more preferably by a plasma CVD method, because coverage can be favorable.

Through the above steps, the transistor 100 can be manufactured.

<Heat Treatment>

A heat treatment may be performed after the insulating layer 107 is formed. Through the heat treatment, oxygen can be supplied from the insulating layer 106 and the insulating layer 107 to the semiconductor layer 102 to reduce oxygen vacancies in the semiconductor layer 102. At this time, the insulating layer 107 prevents oxygen from being released from the insulating layer 106 and the semiconductor layer 102 to the outside. Consequently, formation of oxygen vacancies in the semiconductor layer 102 is prevented and the amount of oxygen that can be released from the insulating layer 106 and supplied to the semiconductor layer 102 can be increased, which can efficiently reduce oxygen vacancies in the semiconductor layer 102.

The above is a description of the example of a manufacturing process of the transistor 100.

Modification Example

In the above manufacturing method, the oxidation treatment of the covering layer 120 may also serve as the process for forming the insulating layer 107, which can simplify the process.

When a sputtering method in an oxygen-containing atmosphere is used as the formation method of the insulating layer 107, the insulating layer 107 can be deposited while oxidizing the covering layer 120.

For example, a metal oxide target is preferably used as a sputtering target for the formation of the insulating layer 107, and a gas containing an oxygen gas is preferably used as a film formation gas. When the metal oxide target is used as a sputtering target, the amount of oxygen, in oxygen contained in a film formation gas, that can react with the covering layer 120 can be increased, compared to a reactive sputtering method using a metal target.

As the film formation gas for forming the insulating layer 107, a gas that contains a rare gas (e.g., argon gas) and oxygen is used. Here, the flow rate of oxygen in the whole film formation gas is preferably 20% or more, more preferably 30% or more, and still more preferably 50% or more. The higher the flow rate of oxygen is, the more efficiently the covering layer 120 can be oxidized.

As described above, by forming the oxidized covering layer 110 in parallel with forming the insulating layer 107 through the same process, a highly reliable transistor 100 can be manufactured without increasing the number of steps.

The above is the description of this modification example.

This embodiment can be combined as appropriate with any of the other embodiments or an example in this specification.

Embodiment 2

In this embodiment, a structural example of a transistor having a structure partly different from that of the transistor described above, and an example of its manufacturing method will be described. Note that description of the portions already described is omitted and only different portions are described in detail. Even if positions and shapes of components are different from those in the above embodiment, the same reference numerals are used as long as the components have the same functions as those in the above embodiment, and detailed description thereof is omitted in some cases.

A semiconductor device of one embodiment of the present invention preferably includes an oxide layer, which contains as its constituent element at least one of the metal elements constituting an oxide semiconductor layer, between the oxide semiconductor layer and an insulating layer that overlaps with the oxide semiconductor layer. In this way, a trap state is prevented from being formed in the interface between the oxide semiconductor layer and the insulating layer that overlaps with the oxide semiconductor layer.

That is, one embodiment of the present invention preferably has a structure in which each of the top surface and the bottom surface of at least the channel formation region of the oxide semiconductor layer is in contact with the oxide layer that functions as a barrier film for preventing formation of an interface state of the oxide semiconductor layer. With this structure, formation of oxygen vacancies and entry of impurities which cause generation of carriers in the oxide semiconductor layer and the interface can be prevented. Thus, a highly purified intrinsic oxide semiconductor layer can be obtained. Obtaining a highly purified intrinsic oxide semiconductor layer refers to purifying or substantially purifying the oxide semiconductor layer to be an intrinsic or substantially intrinsic oxide semiconductor layer. In this way, a change in electrical characteristics of a transistor including the oxide semiconductor layer can be prevented, and a highly reliable semiconductor device can be provided.

Note that in this specification and the like, when an oxide semiconductor layer is referred to as being substantially intrinsic, the carrier density thereof is lower than $1\times10^{17}/cm^3$, lower than $1\times10^{15}/cm^3$, or lower than $1\times10^{13}/cm^3$. With a highly purified intrinsic oxide semiconductor layer, the transistor can have stable electrical characteristics.

More specifically, the following structures can be employed for example.

Structural Example 1

Figure 3A:
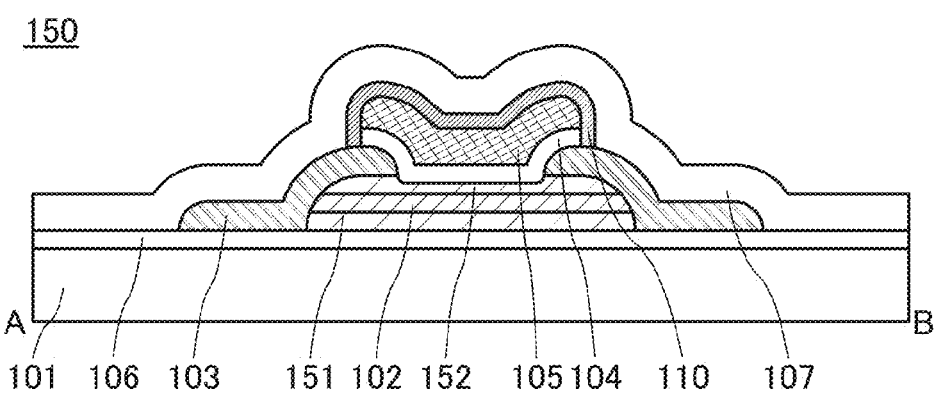
FIGS. 3A and 3B illustrate a structural example of a semiconductor device of an embodiment.
Figure 3B:
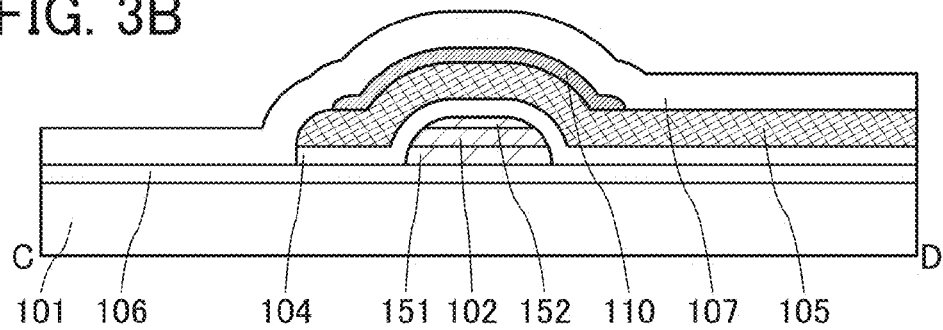

FIGS. 3A and 3B are schematic cross-sectional views of the transistor 150 described below as an example. Note that FIG. 1A can be referred to for the schematic top view. The transistor 150 shown in FIGS. 3A and 3B is different from the transistor 100 described as an example in Embodiment 1, mainly in that it has a first oxide layer 151 and a second oxide layer 152.

The first oxide layer 151 is provided between the insulating layer 106 and the semiconductor layer 102.

The second oxide layer 152 is provided between the semiconductor layer 102 and the gate insulating layer 104. Specifically, the top surface of the second oxide layer 152 is in contact with the bottom surface of the pair of electrodes 103 and the bottom surface of the gate insulating layer 104.

The first oxide layer 151 and the second oxide layer 152 each contain an oxide containing one or more metal elements that are also contained in the semiconductor layer 102.

Note that the boundary between the semiconductor layer 102 and the first oxide layer 151 or the boundary between the semiconductor layer 102 and the second oxide layer 152 is not clear in some cases.

For example, the first oxide layer 151 and the second oxide layer 152 contain In or Ga; typically, a material such as an In—Ga-based oxide, an In—Zn-based oxide, or an In-M-Zn-based oxide (M is Al, Ti, Ga, Y, Zr, La, Ce, Nd, or Hf) that has an energy level of the conduction band minimum closer to the vacuum level than that of the semiconductor layer 102 is used. Typically, the difference between the energy of the conduction band minimum of the first oxide layer 151 or the second oxide layer 152 and the energy of the conduction band minimum of the semiconductor layer 102 is preferably 0.05 eV or higher, 0.07 eV or higher, 0.1 eV or higher, or 0.15 eV or higher and 2 eV or lower, 1 eV or lower, 0.5 eV or lower, or 0.4 eV or lower.

An oxide having a Ga (serving as a stabilizer) content higher than that of the semiconductor layer 102 is used for the first oxide layer 151 and the second oxide layer 152, between which the semiconductor layer 102 is sandwiched, in which case release of oxygen from the semiconductor layer 102 can be inhibited.

When an In—Ga—Zn-based oxide in which the atomic ratio of In to Ga and Zn is 1:1:1 or 3:1:2 is used for the semiconductor layer 102, for example, an In—Ga—Zn-based oxide in which the atomic ratio of In to Ga and Zn is 1:3:2, 1:3:4, 1:3:6, 1:6:4, 1:6:8, 1:6:10, or 1:9:6 can be used for the first oxide layer 151 or the second oxide layer 152. Note that the atomic ratio of each of the semiconductor layer 102, the first oxide layer 151, and the second oxide layer 152 may vary within a range of ±20% of any of the above-described atomic ratios as an error. For the first oxide layer 151 and the second oxide layer 152, materials with the same composition or material with different compositions may be used.

Further, when an In-M-Zn-based oxide is used for the semiconductor layer 102, an oxide containing metal elements in the atomic ratio satisfying the following conditions is preferably used for a target for forming the semiconductor film serving as the semiconductor layer 102. Given that the atomic ratio of the metal elements in the target is In:M:Zn=$x_1$:$y_1$:$z_1$, $x_1/y_1$ is greater than or equal to ⅓ and less than or equal to 6, preferably greater than or equal to 1 and less than or equal to 6, and $z_1/y_1$ is greater than or equal to ⅓ and less than or equal to 6, preferably greater than or equal to 1 and less than or equal to 6. Note that when $z_1/y_1$ is less than or equal to 6, a CAAC-OS film to be described later is easily formed. Typical examples of the atomic ratio of the metal elements in the target are In:M:Zn=1:1:1, In:M:Zn=3:1:2, or the like.

When an In-M-Zn-based oxide is used for the first oxide layer 151 and the second oxide layer 152, an oxide containing metal elements in the following atomic ratio is preferably used for a target for forming oxide films serving as the first oxide layer 151 and the second oxide layer 152. Given that the atomic ratio of the metal elements in the target is In:M:Zn=$x_2$:$y_2$:$z_2$, it is preferable that $x_2/y_2$ be less than $x_1/y_1$, and $z_2/y_2$ be greater than or equal to ⅓ and less than or equal to 6, preferably greater than or equal to 1 and less than or equal to 6. Note that when $z_2/y_2$ is less than or equal to 6, a CAAC-OS film to be described later is easily formed.

Typical examples of the atomic ratio of the metal elements in the target are In:M:Zn=1:3:4, In:M:Zn=1:3:6, In:M:Zn=1:3:8, or the like.

By using a material in which the energy level of the conduction band minimum is closer to the vacuum level than that of the semiconductor layer 102 is for the first oxide layer 151 and the second oxide layer 152, a channel is mainly formed in the semiconductor layer 102, so that the semiconductor layer 102 serves as a main current path. When the semiconductor layer 102 in which a channel is formed is sandwiched between the first oxide layer 151 and the second oxide layer 152 containing the same metal element as described above, formation of interface states between these layers is suppressed, and thus reliability of the electrical characteristics of the transistor is improved.

Note that, without limitation to those described above, a material with an appropriate composition may be used depending on required semiconductor characteristics and electrical characteristics (e.g., field-effect mobility and threshold voltage) of a transistor. In order to obtain the required semiconductor characteristics of the transistor, it is preferable that the carrier density, the impurity concentration, the defect density, the atomic ratio of a metal element to oxygen, the interatomic distance, the density, and the like of each of the semiconductor layer 102, the first oxide layer 151, and the second oxide layer 152 be set to appropriate values.

Here, the thickness of the semiconductor layer 102 is preferably larger than that of the first oxide layer 151. The thicker the semiconductor layer 102 is, the larger the on-state current of the transistor is. The thickness of the first oxide layer 151 may be set as appropriate as long as formation of an interface state at an interface with the semiconductor layer 102 is inhibited. For example, the thickness of the semiconductor layer 102 is larger than that of the first oxide layer 151, preferably 2 times or more, further preferably 4 times or more, still further preferably 6 times or more as large as that of the first oxide layer 151. Note that the above does not apply in the case where the on-state current of the transistor does not need to be increased, and the thickness of the first oxide layer 151 may be larger than or equal to that of the semiconductor layer 102.

The thickness of the second oxide layer 152 may be set as appropriate, in a manner similar to that of the first oxide layer 151, as long as formation of an interface state at an interface with the semiconductor layer 102 is inhibited. For example, the thickness of the second oxide layer 152 may be set smaller than or equal to that of the first oxide layer 151. The second oxide layer 152 preferably has a small thickness because the thick second oxide layer 152 might make it difficult for an electric field by the gate electrode 105 to extend to the semiconductor layer 102. For example, the second oxide layer 152 may be thinner than the semiconductor layer 102. Note that the thickness of the second oxide layer 152 is not limited to the above, and may be set as appropriate depending on a driving voltage of the transistor 150 in consideration of the withstanding voltage of the gate insulating layer 104.

Here, in the case where the semiconductor layer 102 is in contact with an insulating layer including a different constituent element (e.g., an insulating layer including a silicon oxide film), an interface state is sometimes formed at the interface of the two layers and the interface state forms a channel. In that case, a second transistor having a different threshold voltage appears, so that an apparent threshold voltage of the transistor is varied. In the transistor 150, however, the first oxide layer 151 containing one of more kinds of metal elements constituting the semiconductor layer 102 is provided, which makes it difficult for an interface state to be formed at the interface between the first oxide layer 151 and the semiconductor layer 102. Thus, providing the first oxide layer 151 makes it possible to reduce variations and fluctuation in the electrical characteristics of the transistor, such as threshold voltage.

When a channel is formed at the interface between the gate insulating layer 104 and the semiconductor layer 102, interface scattering occurs at the interface and the field-effect mobility of the transistor is reduced. In the transistor 150, however, since the second oxide layer 152 contains one or more kinds of metal elements constituting the semiconductor layer 102, scattering of carriers is less likely to occur at an interface between the semiconductor layer 102 and the second oxide layer 152, and thus the field-effect mobility of the transistor can be increased.

Manufacturing Method Example 1

The transistor 150 can be manufactured by a method in which the manufacturing method of the transistor 100 and the modification example described in Embodiment 1 are partly changed.

Specifically, instead of forming the oxide semiconductor film as the semiconductor layer 102, a first oxide film serving as the first oxide layer 151, an oxide semiconductor film, and a second oxide film serving as the second oxide layer 152 are formed in this order. After that, the first oxide film, the oxide semiconductor film and the second oxide film are processed into an island shape, whereby the first oxide layer 151, the semiconductor layer 102 and the second oxide layer 152 can be formed.

The first oxide film and the second oxide film can be formed by a method similar to that of the semiconductor film described above.

In particular, the first oxide film, the semiconductor film and the second oxide film are preferably formed successively without being exposed to the air. By successively forming these films, formation of interface defects thereof can be inhibited.

The above manufacturing method example can be referred to for the subsequent steps. In this manner, the transistor 150 shown in FIGS. 3A and 3B can be manufactured.

The above is the description of Structural Example 1.

Structural Example 2

Figure 4A:
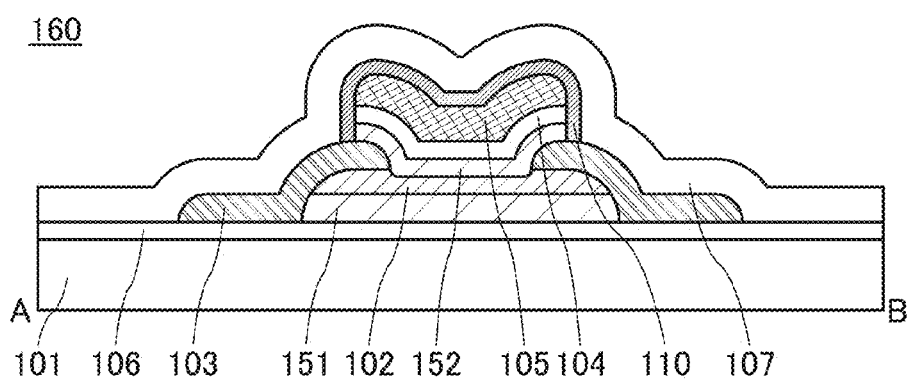
FIGS. 4A and 4B illustrate a structural example of a semiconductor device of an embodiment.
Figure 4B:
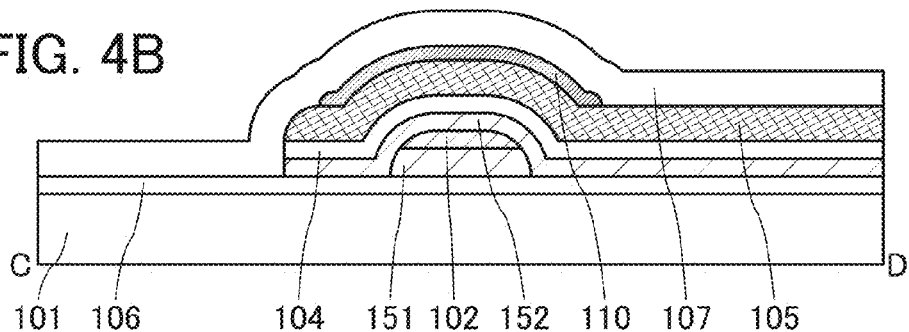

FIGS. 4A and 4B are schematic cross-sectional views of a transistor 160 described below as an example. Note that FIG. 1A can be referred to for the schematic top view. The transistor 160 shown in FIGS. 4A and 4B is different from the above-described transistor 150 mainly in that the second oxide layer 152 has a different shape.

In the transistor 160, the bottom surface of the second oxide layer 152 is in contact with the top surface of each of the pair of electrodes 103. Further, the second oxide layer 152 is in contact with the top surface and side surface of the semiconductor layer 102 in a region where the pair of electrodes 103 are not provided.

In the structure shown in FIGS. 4A and 4B, the second oxide layer 152, the gate insulating layer 104 and the gate electrode 105 are processed with the use of the same photomask so that the top-view shape of the second oxide layer 152 and the top-view shape of the gate insulating layer 104 are substantially the same as the top-view shape of the gate electrode 105.

Further, the covering layer 110 is in contact not only with the edge of the gate insulating layer 104 but also with the edge of the second oxide layer 152. In such a structure as the transistor 160, difference in height between the top surface of the pair of electrodes 103 and the top surface of the gate electrode 105 is larger by the thickness of the second oxide layer 152 than in the above-described transistors 100 and 150. Accordingly, a step at the edge of the gate electrode 105 may deteriorate the coverage with a layer to be formed thereover (e.g., the insulating layer 107). However, the covering layer 110 is provided to cover the side surfaces of the second oxide layer 152, gate insulating layer 104 and gate electrode 105, whereby the effect of the step is reduced. In this way, the coverage with a layer to be formed thereover can be improved. If the covering layer 110 is provided such that the thickness (in the direction parallel to a formation surface of the substrate 101) thereof gets greater as it is close to the pair of electrodes 103, in particular, the coverage with the insulating layer 107 can be improved.

Since the covering layer 110 is insulated or has sufficiently high resistance, an electrical short circuit between the gate electrode 105 and the second oxide layer 152 via the covering layer 110 does not occur, and a favorable transistor characteristics can be obtained.

As illustrated in FIG. 4B, a channel formation region of the transistor 160 is in contact with the second oxide layer 152 not only at the top surface but also at the side surface of the semiconductor layer 102. That is, the channel formation region of the semiconductor layer 102 is surrounded by the first oxide layer 151 and the second oxide layer 152. Furthermore, the gate electrode 105 is provided to cover not only the top surface but also the side surface of the semiconductor layer 102.

In this way, since the gate electrode 105 covers not only the top surface but also the side surface of the semiconductor layer 102, the gate electrode 105 can apply an electric field also from the side surface side of the semiconductor layer 102. In addition, owing to the second oxide layer 152 provided in contact with the side surface of the semiconductor layer 102, formation of an interface state can be prevented also at the side surface of the semiconductor layer 102. As a result, a channel formed near the side surface of the semiconductor layer 102 can be actively used and a change in electrical characteristics of a transistor can be suppressed. Consequently, a transistor with high on-state current and high reliability can be obtained.

Manufacturing Method Example 2

The transistor 160 can be manufactured by a method in which the manufacturing method or the modification example of the transistor 100 described in Embodiment 1 or Manufacturing Method Example 1 is partly changed.

Specifically, instead of forming the oxide semiconductor film as the semiconductor layer 102, a first oxide film and an oxide semiconductor film are formed in this order. After that, the first oxide film and the oxide semiconductor film are processed into an island shape, whereby the first oxide layer 151 and the semiconductor layer 102 are formed. Then, a pair of electrodes 103 is formed in a manner similar to the above.

In the formation process of the gate insulating layer 104 and the gate electrode 105, a second oxide film is formed before the insulating film 114 is formed. Then, the conductive film 115, the insulating film 114 and the second oxide film are processed with the use of the same photomask, whereby the gate electrode 105, the gate insulating layer 104, the second oxide layer 152 and the covering layer 120 that covers at least the side surfaces of these are formed.

The above manufacturing method example can be referred to for the subsequent steps. In this manner, the transistor 160 shown in FIGS. 4A and 4B can be manufactured.

The above is the description of Structural Example 2.

This embodiment can be combined as appropriate with any of the other embodiments or an example in this specification.

Embodiment 3

An oxide semiconductor that can be favorably used for a semiconductor layer of a semiconductor device of one embodiment of the present invention is described in this embodiment.

An oxide semiconductor has a wide energy gap of 3.0 eV or more. A transistor using an oxide semiconductor film obtained by processing an oxide semiconductor in an appropriate condition while sufficiently reducing the carrier density can have much lower leakage current between a source and a drain in an off state (off-state current) than a conventional transistor using silicon.

In the case where an oxide semiconductor film is used for a transistor, the thickness of the oxide semiconductor film is preferably greater than or equal to 2 nm and less than or equal to 40 nm.

An oxide semiconductor that can be used for a transistor preferably contains at least indium (In) or zinc (Zn). In particular, In and Zn are preferably contained. In addition, as a stabilizer for reducing variation in electrical characteristics of the transistor using the oxide semiconductor, one or more selected from gallium (Ga), tin (Sn), hafnium (Hf), zirconium (Zr), titanium (Ti), scandium (Sc), yttrium (Y), and a lanthanoid (such as cerium (Ce), neodymium (Nd), or gadolinium (Gd), for example) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In, Ga, and Zn. The In—Ga—Zn-based oxide may contain another metal element in addition to In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co, or the above-described element as a stabilizer. Alternatively, as the oxide semiconductor, a material represented by a chemical formula, $In_2SnO_5(ZnO)_n$ (n>0, n is an integer) may be used.

For example, In—Ga—Zn-based oxide with an atomic ratio of In:Ga:Zn=1:1:1, 1:3:2, 1:3:4, 1:3:6, 3:1:2, or 2:1:3, or an oxide whose composition is in the neighborhood of the above compositions may be used.

When the oxide semiconductor film contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor to fill oxygen vacancies increased by the dehydration treatment (dehydrogenation treatment). In this specification and the like, supplying oxygen to an oxide semiconductor film may be expressed as oxygen adding treatment, and treatment for making the oxygen content of an oxide semiconductor film be in excess of that of the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

Thus, the transistor including an i-type or substantially i-type oxide semiconductor film can have extremely favorable off-state current characteristics. For example, the drain current at the time when the transistor using an oxide semiconductor film is in an off-state can be less than or equal to $1\times10^{-18}$ A, preferably less than or equal to $1\times10^{-21}$ A, further preferably less than or equal to $1\times10^{-24}$ A at room temperature (about 25° C.); or less than or equal to $1\times10^{-15}$ A, preferably less than or equal to $1\times10^{-18}$ A, further preferably less than or equal to $1\times10^{-21}$ A at 85° C. Note that an off state of an n-channel transistor refers to a state where the gate voltage is sufficiently lower than the threshold voltage. Specifically, the transistor is in an off state when the gate voltage is lower than the threshold voltage by 1V or more, 2V or more, or 3V or more.

A structure of the oxide semiconductor film is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films including a plurality of c-axis aligned crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 $nm^2$ or more, 5 $\mu m^2$ or more, or 1000 $\mu m^2$ or more is observed in some cases in the high-resolution plan TEM image.

When observing the CAAC-OS film in a combined analysis image of a bright-field image and a diffraction pattern with the use of a transmission electron microscope (TEM) (the combined analysis image is also referred to as a high-resolution TEM image), a plurality of crystal parts can be found. In a high-resolution TEM image, a boundary between crystal parts, that is, a grain boundary is not clearly found. Thus, in the CAAC-OS film, a reduction in electron mobility due to the grain boundary is less likely to occur.

In a high-resolution cross-sectional TEM image of the CAAC-OS film observed in a direction substantially parallel to a sample surface, metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In a high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

From the results of the high-resolution cross-sectional TEM image and the high-resolution plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. In the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis of the crystal might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (such electrical characteristics are also referred to as normally on). The highly purified intrinsic or substantially highly purified intrinsic oxide semiconductor film has few carrier traps. Accordingly, the transistor including the oxide semiconductor film has little change in electrical characteristics and high reliability. Electric charge trapped by the carrier traps in the oxide semiconductor film takes a long time to be released, and might behave like fixed electric charge. Thus, the transistor that uses the oxide semiconductor film having high impurity concentration and a high density of defect states has unstable electrical characteristics in some cases.

With the use of the CAAC-OS film in a transistor, a change in the electrical characteristics of the transistor due to irradiation with visible light or ultraviolet light is small.

Next, a microcrystalline oxide semiconductor film is described.

A microcrystalline oxide semiconductor film has a region where a crystal part can be found in the high-resolution TEM image and a region where a crystal part cannot be found clearly in the high-resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high-resolution TEM image, for example, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a diffraction pattern like a halo pattern appears in a selected-area electron diffraction pattern of the nc-OS film that is obtained by using an electron beam having a probe diameter (e.g., larger than or equal to 50 nm) larger than the diameter of a crystal part. Meanwhile, spots are observed in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are observed in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked-layer film including two or more films of an amorphous oxide semiconductor film, a microcrystalline oxide semiconductor film, and a CAAC-OS film, for example.

Note that this embodiment can be combined as appropriate with any of the other embodiments or example in this specification.

Embodiment 4

In this embodiment, an example of a semiconductor device (memory device) that includes a transistor provided with the oxide semiconductor according to one embodiment of the present invention, which can hold stored data even when not powered, and which has an unlimited number of write cycles, will be described with reference to drawings.

Figure 5:
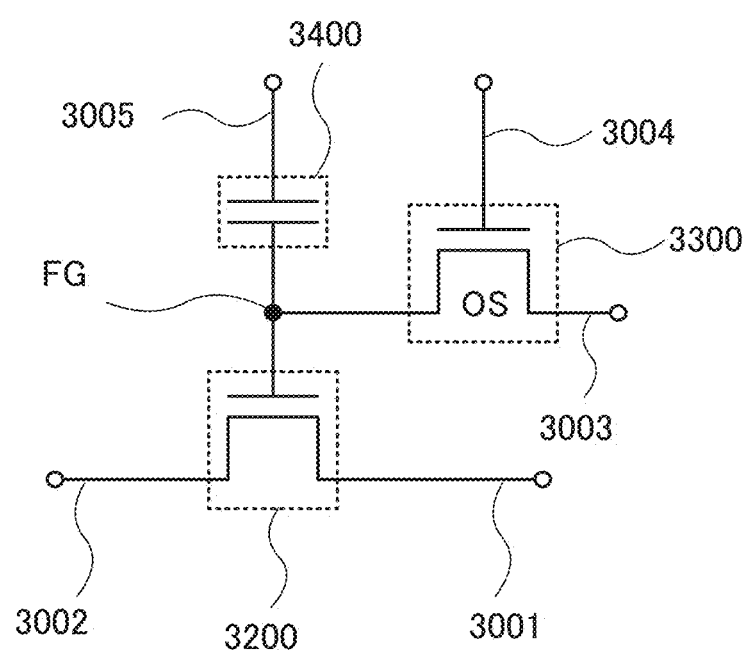
FIG. 5 is a circuit diagram of a semiconductor device of an embodiment.

FIG. 5 is a circuit diagram of a semiconductor device.

The semiconductor device illustrated in FIG. 5 includes a transistor 3200 including a first semiconductor material, a transistor 3300 including a second semiconductor material, and a capacitor 3400. As the transistor 3300, the transistor described in the above embodiments can be used.

Here, the first semiconductor material and the second semiconductor material are preferably materials having different band gaps. For example, a semiconductor material other than an oxide semiconductor (e.g., silicon, germanium, silicon germanium, silicon carbide, or gallium arsenide) can be used as the first semiconductor material, and the oxide semiconductor described in the above embodiment can be used as the second semiconductor material. A transistor using single crystal silicon, for example, as the material other than an oxide semiconductor can operate at high speed easily. A transistor including an oxide semiconductor has low off-state current.

The transistor 3300 is a transistor in which a channel is formed in a semiconductor layer including an oxide semiconductor. Since the off-state current of the transistor 3300 is low, stored data can be retained for a long period owing to such a transistor. In other words, power consumption can be sufficiently reduced because a semiconductor device in which refresh operation is unnecessary or the frequency of refresh operation is extremely low can be provided.

In FIG. 5, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. The gate electrode of the transistor 3200 and the other of the source electrode and the drain electrode of the transistor 3300 are electrically connected to the one electrode of the capacitor 3400. A fifth wiring 3005 is electrically connected to the other electrode of the capacitor 3400.

The semiconductor device in FIG. 5 utilizes a characteristic in which the potential of the gate electrode of the transistor 3200 can be held, and thus enables writing, holding, and reading of data as follows.

Writing and holding of data will be described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, predetermined charge is supplied to the gate electrode of the transistor 3200 (writing). Here, charge for supplying either of two different potential levels (hereinafter referred to as low-level charge and high-level charge) is given. Then, the potential of the fourth wiring 3004 is set to a potential at which the transistor 3300 is turned off, so that the transistor 3300 is turned off. Thus, the charge given to the gate electrode of the transistor 3200 is held (holding).

Since the off-state current of the transistor 3300 is extremely small, the charge of the gate electrode of the transistor 3200 is held for a long time.

Next, reading of data will be described. By supplying an appropriate potential (a reading potential) to the fifth wiring 3005 while supplying a predetermined potential (a constant potential) to the first wiring 3001, the potential of the second wiring 3002 varies depending on the amount of charge held in the gate electrode of the transistor 3200. This is because in general, when the transistor 3200 is an n-channel transistor, an apparent threshold voltage $V_{th\_H}$ in the case where a high-level charge is given to the gate electrode of the transistor 3200 is lower than an apparent threshold voltage $V_{th\_L}$ in the case where a low-level charge is given to the gate electrode of the transistor 3200. Here, an apparent threshold voltage refers to the potential of the fifth wiring 3005 which is needed to turn on the transistor 3200. Thus, by setting the potential of the fifth wiring 3005 to a potential $V_0$ which is between $V_{th\_H}$ and $V_{th\_L}$, charge given to the gate electrode of the transistor 3200 can be determined. For example, in the case where the high-level charge is supplied in writing, when the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($<V_{th\_L}$) the transistor 3200 remains off. Therefore, the data stored in the gate electrode can be read by determining the potential of the second wiring 3002.

Note that in the case where memory cells are arrayed to be used, only data of desired memory cells needs to be read. In the case where such reading is not performed, when the transistor 3200 is of an n-channel type, the fifth wiring 3005 may be supplied with a potential at which the transistor 3200 is turned off regardless of the state of the gate electrode, that is, a potential smaller than $V_{th\_H}$. Alternatively, when the transistor 3200 is of a p-channel type, the fifth wiring 3005 may be supplied with a potential at which the transistor 3200 is turned on regardless of the state of the gate electrode, that is, a potential higher than $V_{th\_L}$.

When a transistor having a channel formation region formed using an oxide semiconductor and having extremely small off-state current is used for the semiconductor device in this embodiment, the semiconductor device can store data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating layer does not arise. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily achieved.

Note that this embodiment can be combined as appropriate with any of the other embodiments or an example in this specification.

Embodiment 5

In this embodiment, a CPU that includes the transistor described in the above embodiments or the memory device described in the above embodiment will be described.

Figure 6:
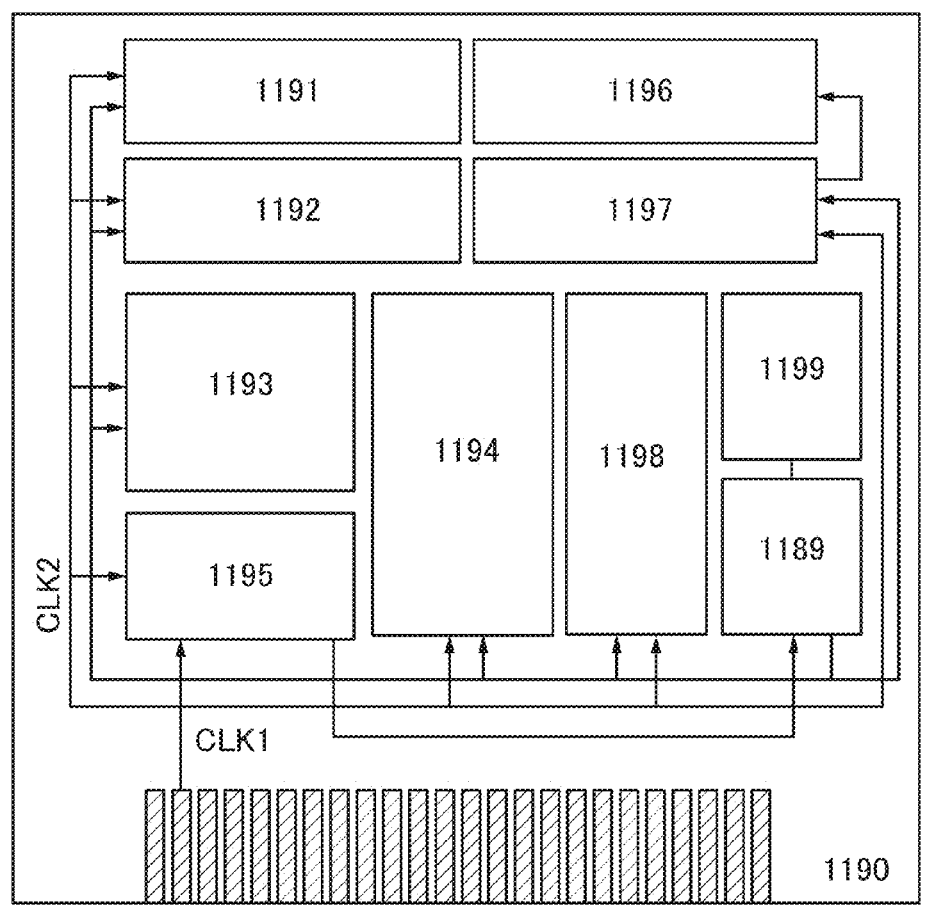
FIG. 6 is a block diagram of a semiconductor device of an embodiment.

FIG. 6 is a block diagram illustrating an example of the configuration of a CPU at least part of which includes the transistor described in the above embodiments.

The CPU illustrated in FIG. 6 includes an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Needless to say, the CPU shown in FIG. 6 is just an example in which the configuration has been simplified, and an actual CPU may have various configurations depending on the use. For example, the CPU may have the following configuration: a structure including the CPU illustrated in FIG. 6 or an arithmetic circuit is considered as one core; a plurality of the cores is included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 6, a memory cell is provided in the register 1196. For the memory cell of the register 1196, any of the transistors described in the above embodiments can be used.

In the CPU illustrated in FIG. 6, the register controller 1197 selects operation of retaining data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 7:
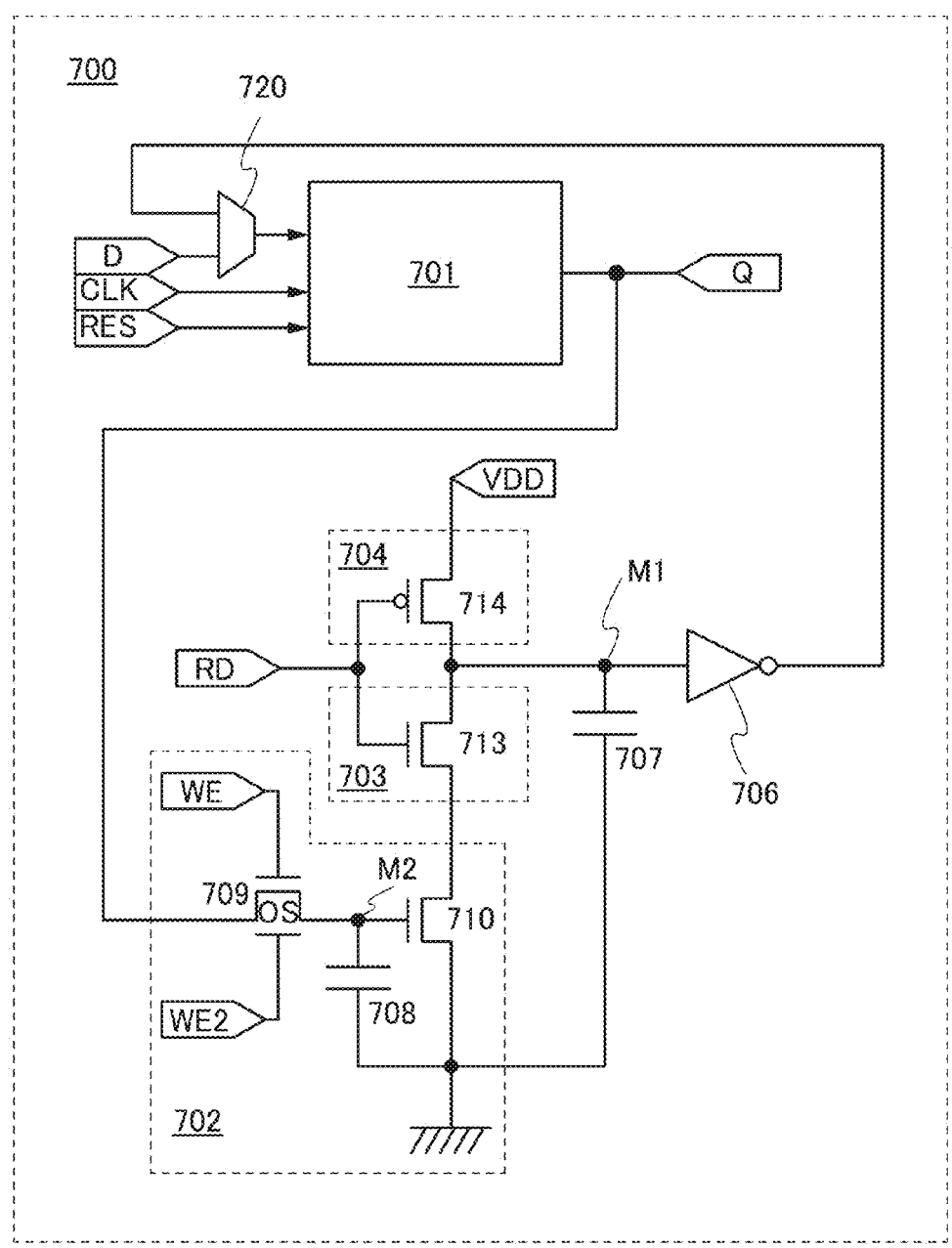
FIG. 7 is a circuit diagram illustrating a memory device of an embodiment.

FIG. 7 is an example of a circuit diagram of a memory element that can be used as the register 1196. A memory element 700 includes a circuit 701 in which stored data is volatile when power supply is stopped, a circuit 702 in which stored data is nonvolatile when power supply is stopped, a switch 703, a switch 704, a logic element 706, a capacitor 707, and a circuit 720 having a selecting function. The circuit 702 includes a capacitor 708, a transistor 709, and a transistor 710. Note that the memory element 700 may further include another element such as a diode, a resistor, or an inductor, as needed.

Here, the memory device described in the above embodiment can be used as the circuit 702. When supply of the power supply voltage to the memory element 700 is stopped, a ground potential (0 V) or a potential at which the transistor 709 is turned off continues to be input to a gate of the transistor 709 in the circuit 702. For example, the gate of the transistor 709 is grounded through a load such as a resistor.

An example in which the switch 703 is a transistor 713 having one conductivity type (e.g., an n-channel transistor) and the switch 704 is a transistor 714 having a conductivity type opposite to the one conductivity type (e.g., a p-channel transistor) is described. Here, a first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a line which can supply a low power supply potential (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a line which can supply a power supply potential VDD. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to the line which can supply a low power supply potential (e.g., a GND line). The other of the pair of electrodes of the capacitor 708 can be supplied with a constant potential. For example, the other of the pair of electrodes of the capacitor 708 can be supplied with a low power supply potential (e.g., GND) or a high power supply potential (e.g., VDD). The other of the pair of electrodes of the capacitor 708 is electrically connected to the line which can supply a low power supply potential (e.g., a GND line).

The capacitor 707 and the capacitor 708 are not necessarily provided as long as the parasitic capacitance of the transistor, the wiring, or the like is actively utilized.

A control signal WE is input to the first gate (first gate electrode) of the transistor 709. As for each of the switch 703 and the switch 704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data held in the circuit 701 is input to the other of the source and the drain of the transistor 709. FIG. 7 illustrates an example in which a signal output from the circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 7, a signal output from the second terminal of the switch 703 (the other of the source and the drain of the transistor 713) is input to the circuit 701 through the logic element 706 and the circuit 720; however, this embodiment is not limited thereto. The signal output from the second terminal of the switch 703 (the other of the source and the drain of the transistor 713) may be input to the circuit 701 without its logic value being inverted. For example, in the case where a node in which a signal obtained by inversion of the logic value of a signal input from the input terminal is held is provided in the circuit 701, the signal output from the second terminal of the switch 703 (the other of the source and the drain of the transistor 713) can be input to the node.

As the transistor 709 in FIG. 7, the transistor described in the above embodiments can be used. The transistor 709 preferably includes a second gate (second gate electrode). The control signal WE can be input to the first gate and the control signal WE2 can be input to the second gate. The control signal WE2 may be a signal having a constant potential. As the constant potential, for example, a ground potential GND or a potential lower than a source potential of the transistor 709 is selected. The control signal WE2 is a potential signal for controlling the threshold voltage of the transistor 709, and Icut of the transistor 709 (a current when a gate voltage of the transistor is 0 V) can be further reduced. As the transistor 709, the transistor without the second gate can be used.

Further, in FIG. 7, the transistors included in the memory element 700 except for the transistor 709 can each be a transistor in which a channel is formed in a layer formed using a semiconductor other than an oxide semiconductor or in the substrate 1190. For example, the transistor can be a transistor in which a channel is formed in a silicon layer or a silicon substrate. Alternatively, a transistor in which a channel is formed in an oxide semiconductor layer can be used for all the transistors used for the memory element 700. Further alternatively, in the memory element 700, a transistor in which a channel is formed in an oxide semiconductor layer can be included besides the transistor 709, and a transistor in which a channel is formed in a layer formed using a semiconductor other than an oxide semiconductor or in the substrate 1190 can be used for the rest of the transistors.

As the circuit 701 in FIG. 7, for example, a flip-flop circuit can be used. As the logic element 706, for example, an inverter, a clocked inverter, or the like can be used.

The semiconductor device of one embodiment of the present invention can, in a period during which the memory element 700 is not supplied with the power supply voltage, retain data stored in the circuit 701 by the capacitor 708 which is provided in the circuit 702.

The off-state current of a transistor in which a channel is formed in an oxide semiconductor layer is extremely low. For example, the off-state current of a transistor whose channel is formed in an oxide semiconductor layer is much lower than that of a transistor whose channel is formed in crystalline silicon. Thus, when such a transistor including an oxide semiconductor is used for the transistor 709, a signal held in the capacitor 708 is held for a long time also in a period during which the power supply voltage is not supplied to the memory element 700. The memory element 700 can accordingly hold the stored content (data) also in a period during which the supply of the power supply voltage is stopped.

Since the switch 703 and the switch 704 are provided, the memory element performs a pre-charge operation; thus, the time required for the circuit 701 to hold original data again after the supply of the power supply voltage is restarted can be shortened.

In the circuit 702, a signal held by the capacitor 708 is input to the gate of the transistor 710. Therefore, after supply of the power supply voltage to the memory element 700 is restarted, the signal held by the capacitor 708 can be converted into the one corresponding to the state (the on state or the off state) of the transistor 710 to be read from the circuit 702. Consequently, an original signal can be accurately read even when a potential corresponding to the signal held by the capacitor 708 fluctuates to some degree.

By applying the above-described memory element 700 to a memory device such as a register or a cache memory included in a processor, data in the memory device can be prevented from being lost owing to the stop of the supply of the power supply voltage. Further, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be reduced.

Although an example in which the memory element 700 is used in a CPU is described in this embodiment, the memory element 700 can also be used in a digital signal processor (DSP), a custom LSI, an LSI such as a programmable logic device (PLD), and a radio frequency identification (RF-ID).

Note that this embodiment can be combined as appropriate with any of the other embodiments or an example in this specification.

Embodiment 6

In this embodiment, examples of an electronic device which can use a semiconductor device such as the transistor, the memory device, or the CPU and the like (including a DSP, a custom LSI, a PLD, and an RF-ID) described in the above embodiments are described.

The transistor, the memory device, the CPU or the like described in any of the above embodiments as an example can be used in various electronic devices (including amusement devices). Examples of the electronic devices include display devices of televisions, monitors, and the like, lighting devices, personal computers, word processors, image reproduction devices, portable audio players, radios, tape recorders, stereos, phones, cordless phones, mobile phones, car phones, transceivers, wireless devices, game machines, calculators, portable information terminals, electronic notebooks, e-book readers, electronic translators, audio input devices, video cameras, digital still cameras, electric shavers, IC chips, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipment such as dialyzers and X-ray diagnostic equipment. In addition, the examples of the electronic devices include alarm devices such as smoke detectors, heat detectors, gas alarm devices, and security alarm devices. Further, the examples include industrial equipment such as guide lights, traffic lights, belt conveyors, elevators, escalators, industrial robots, and power storage systems. In addition, moving objects and the like driven by fuel engines and electric motors using power from non-aqueous secondary batteries are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Some specific examples of these electronic devices are illustrated in FIGS. 8A to 8C.

Figure 8A:
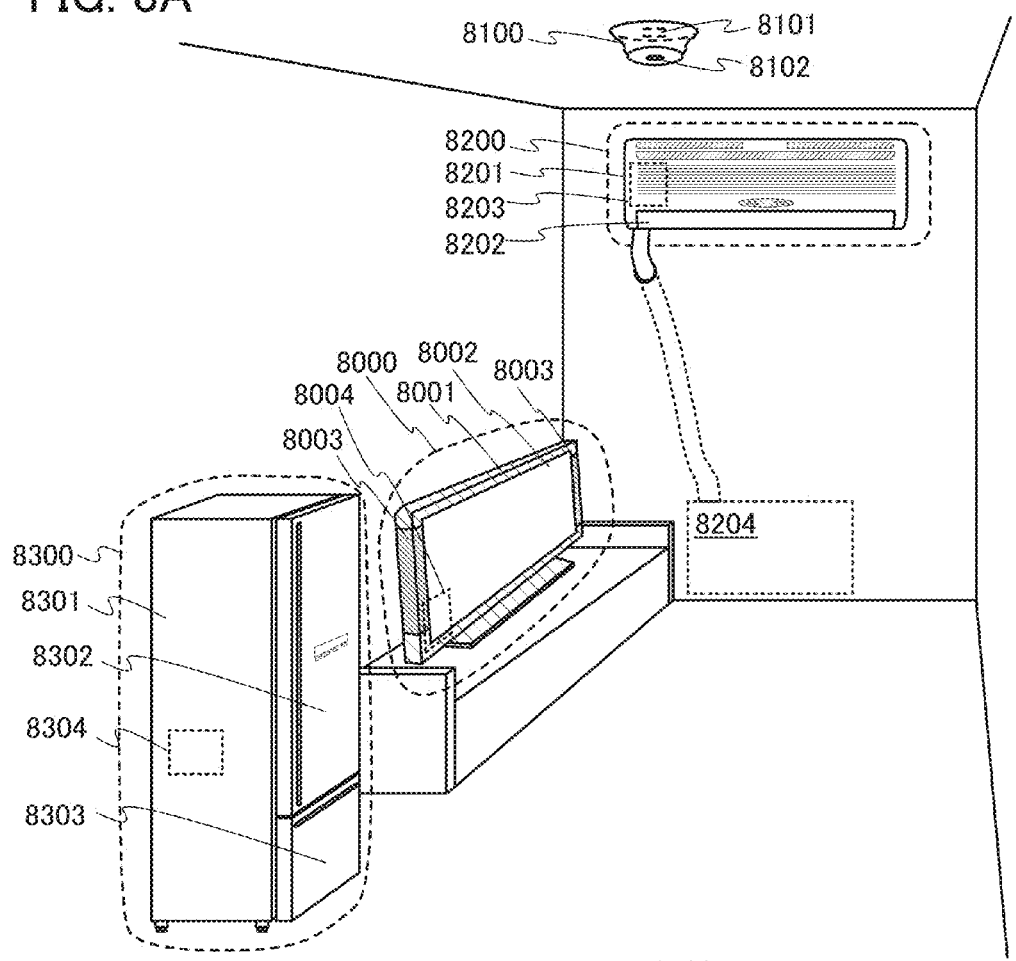
FIGS. 8A to 8C illustrate electronic devices of embodiments.
Figure 8B:
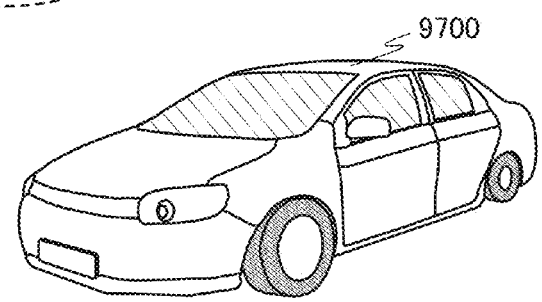
Figure 8C:
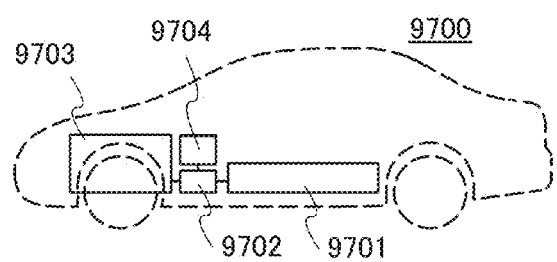

In a television set 8000 illustrated in FIG. 8A, a display portion 8002 is incorporated in a housing 8001. The display portion 8002 can display an image and a speaker portion 8003 can output sound. Any of the transistors described in the above embodiments can be used in a pixel or a driver circuit for operating the display portion 8002 incorporated in the housing 8001.

A semiconductor display device such as a liquid crystal display device, a light-emitting device in which a light-emitting element such as an organic EL element is provided in each pixel, an electrophoretic display device, a digital micromirror device (DMD), or a plasma display panel (PDP) can be used for the display portion 8002.

The television set 8000 may be provided with a receiver, a modem, and the like. With the receiver, the television set 8000 can receive a general television broadcast. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU 8004 for performing information communication or a memory. The transistor, the memory device, or the CPU described in any of the above embodiments is used for the CPU 8004 or the memory, whereby power consumption can be reduced.

An alarm device 8100 illustrated in FIG. 8A is a residential fire alarm, and includes a sensor portion 8102 for smoke or heat and a microcomputer 8101. The microcomputer 8101 is an example of an electric device including the transistor, the memory device, or the CPU described in any of the above embodiments.

An air conditioner which includes an indoor unit 8200 and an outdoor unit 8204 illustrated in FIG. 8A is an example of an electric device including the transistor, the memory device, the CPU, or the like described in any of the above embodiments. Specifically, the indoor unit 8200 includes a housing 8201, an air outlet 8202, a CPU 8203, and the like. Although FIG. 8A shows the case where the CPU 8203 is provided in the indoor unit 8200, the CPU 8203 may be provided in the outdoor unit 8204. Alternatively, the CPU 8203 may be provided in each of the indoor unit 8200 and the outdoor unit 8204. When any of the transistors described in the above embodiments is used for the CPU in the air conditioner, power consumption of the air conditioner can be reduced.

An electric refrigerator-freezer 8300 illustrated in FIG. 8A is an example of an electric device including the transistor, the memory device, the CPU, or the like described in any of the above embodiments. Specifically, the electric refrigerator-freezer 8300 includes a housing 8301, a door for a refrigerator 8302, a door for a freezer 8303, a CPU 8304, and the like. The CPU 8304 is provided in the housing 8301 in FIG. 8A. When any of the transistors described in the above embodiments is used for the CPU 8304 of the electric refrigerator-freezer 8300, power consumption of the electric refrigerator-freezer 8300 can be reduced.

FIGS. 8B and 8C illustrate an example of an electric vehicle as an example of an electric device. An electric vehicle 9700 is equipped with a secondary battery 9701. The output of the electric power of the secondary battery 9701 is adjusted by a circuit 9702 and the electric power is supplied to a driving device 9703. The circuit 9702 is controlled by a processing unit 9704 including a ROM, a RAM, a CPU, or the like which is not illustrated. When any of the transistors described in the above embodiments is used for the CPU in the electric vehicle 9700, power consumption of the electric vehicle 9700 can be reduced.

The driving device 9703 includes a DC motor or an AC motor either alone or in combination with an internal-combustion engine. The processing unit 9704 outputs a control signal to the circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The circuit 9702 adjusts the electric energy supplied from the secondary battery 9701 in accordance with the control signal of the processing unit 9704 to control the output of the driving device 9703. In the case where the AC motor is mounted, although not illustrated, an inverter, which converts direct current into alternate current, is also incorporated.

This embodiment can be combined as appropriate with any of the other embodiments or an example in this specification.

Example

In this example, transistors were manufactured, and their cross sections were observed and their electrical characteristics were measured.

<Manufacture of Transistors>

Three kinds of samples of transistors, Samples 1 to 3, were manufactured. In the following description, the three kinds of samples are manufactured through a similar process unless otherwise described.

A silicon wafer was used as the substrate. First, the substrate was subjected to thermal oxidation, so that a thermal oxidation film was formed over the substrate surface. Next, an approximately 300-nm-thick silicon oxynitride film was formed over the thermal oxidation film by a plasma CVD method, then the surface of the silicon oxynitride film was planarized by a chemical mechanical polishing (CMP) method.

Subsequently, an oxide semiconductor film (OS1) and an oxide semiconductor film (OS2) having a different composition from OS1 were formed in this order by a sputtering method. Next, an approximately 5-nm-thick tungsten film was formed by a sputtering method. After that, an approximately 20-nm-thick nonphotosensitive organic resin film and an approximately 100-nm-thick negative resist film were formed over the tungsten film, exposure was performed on the resist film by scanning with an electron beam, and development was performed, so that the resist film pattern was formed. Subsequently, the organic resin film and the tungsten film were etched using the resist film as a mask, and the resist film was removed. Then, the oxide semiconductor films (OS1 and OS2) were etched using the tungsten film as a mask, and the tungsten film was removed. In this manner, an island-shaped first oxide layer and an island-shaped semiconductor layer were obtained.

Here, in Sample 1 and Sample 2, the thicknesses of the oxide semiconductor film (OS1) and the oxide semiconductor film (OS2) were 20 nm and 15 nm, respectively. In Sample 3, the thicknesses of the oxide semiconductor film (OS1) and the oxide semiconductor film (OS2) were 10 nm and 40 nm, respectively.

Next, an approximately 10-nm-thick tungsten film was formed by a sputtering method, and an approximately 20-nm-thick nonphotosensitive organic resin film was formed thereover. Then, in a manner similar to the above, a resist film pattern was formed over the tungsten film. Subsequently, the tungsten film and the organic resin film were etched using the resist film as a mask, whereby a pair of electrodes over the island-shaped semiconductor layer were obtained.

Next, an approximately 5-nm-thick oxide semiconductor film (OS3) was formed by a sputtering method. Then, an approximately 10-nm-thick silicon oxynitride film was formed by a plasma CVD method. Subsequently, an approximately 10-nm-thick titanium nitride film and an approximately 10-nm-thick tungsten film were successively formed by a sputtering method. Then, in a manner similar to the above, a resist film pattern was formed over the tungsten film.

Next, the tungsten film and the titanium nitride film were etched by dry etching, using the resist film as a mask. Etching was first performed for approximately five seconds with the use of a mixed gas of $Cl_2$ (flow rate: 45 sccm), $CF_4$ (flow rate: 55 sccm) and $O_2$ (flow rate: 55 sccm) as the etching gas, under the following conditions: ICP power was 3000 W, the bias power was 110 W, the pressure was 0.67 Pa, and the substrate temperature was 40° C. Then, another etching was performed for approximately 12 seconds with the use of a mixed gas of $Cl_2$ (flow rate: 50 sccm) and $BCl_3$ (flow rate: 150 sccm) as the etching gas, under the following conditions: ICP power was 1000 W, the bias power was 50 W, the pressure was 0.67 Pa, and the substrate temperature was 40° C.

Next, the silicon oxynitride film was etched. Etching was performed for approximately 16 seconds with the use of a mixed gas of $CHF_3$ (flow rate: 56 sccm) and He (flow rate: 144 sccm) as the etching gas, under the following conditions: ICP power was 25 W, the bias power was 425 W, and the pressure was 7.5 Pa.

Next, the oxide semiconductor film (OS3) was etched. Etching was performed for approximately 22 seconds with the use of a mixed gas of $CH_4$ (flow rate: 16 sccm) and Ar (flow rate: 32 sccm) as the etching gas, under the following conditions: ICP power was 600 W, the bias power was 100 W, the pressure was 1.0 Pa, and the substrate temperature was 70° C.

After that, the resist film was removed by a plasma treatment (also referred to as ashing) in an oxygen atmosphere. At this stage, a gate electrode, a gate insulating layer, and a second oxide layer were obtained.

The process for Sample 3 was completed at this stage and the cross section thereof was observed. The obtained cross-sectional observation image will be described later.

Next, only in Sample 2, a covering layer was etched with the use of hydrofluoric acid. Etching was performed by discharging diluted hydrofluoric acid while rotating the substrate. A mixture of 0.5 wt % hydrofluoric acid and water with a ratio of 1:100 was used as the hydrofluoric acid.

Then, as an insulating layer, an approximately 20-nm-thick aluminum oxide film and an approximately 150-nm-thick silicon oxynitride film were formed.

The aluminum oxide film was formed by a sputtering method. For the film formation, aluminum oxide was used as the sputtering target, a mixed gas of Ar and $O_2$ (the flow rate of each was 25 sccm) was used as the film formation gas, and the distance between the substrate and the sputtering target was 60 mm. The pressure was 0.4 Pa and the RF power was 2500 W.

The silicon oxynitride film was formed by a plasma CVD method.

Through the above-described process, Sample 1 and Sample 2 were manufactured. Sample 2 is different from Sample 1 in that Sample 2 went through the process of etching the covering layer by hydrofluoric acid.

<Cross-Sectional Observation>

The cross sections of the manufactured samples were observed with a scanning transmission electron microscope (STEM).

Figure 9A:
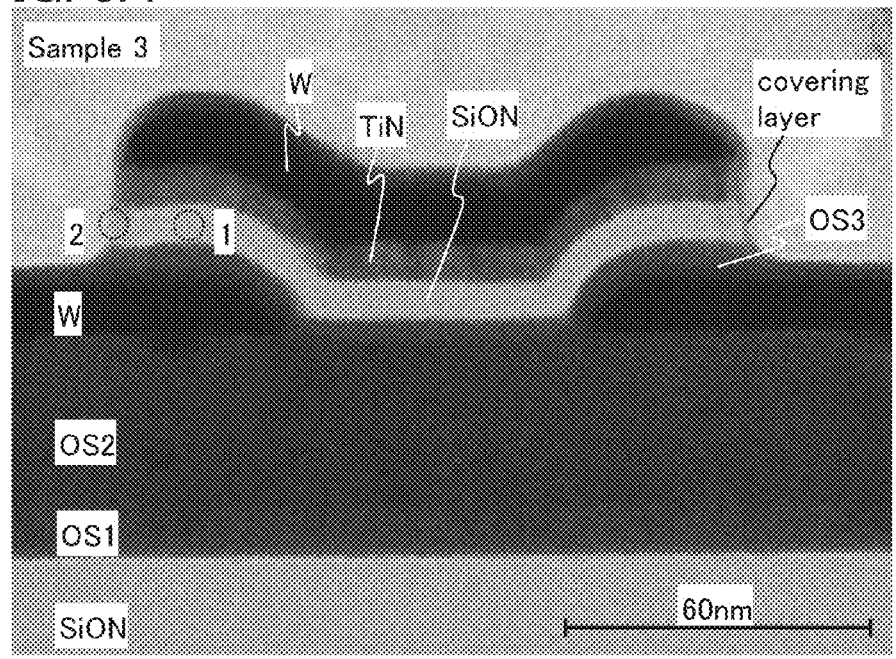
FIG. 9A is a cross-sectional observation image and FIGS. 9B and 9C are EDX analysis results of a sample of an example.

First, concerning Sample 3, the cross-sectional observation image of the transistor in the channel length direction is shown in FIG. 9A. FIG. 9A is a phase contrast image (also referred to as a transmitted electron (TE) image).

As seen from the cross-sectional observation image shown in FIG. 9A, the side surfaces of the gate electrode, gate insulating layer and second oxide layer were processed so as to be substantially aligned, and a covering layer (first covering layer) was formed to cover these side surfaces and the top surface of the gate electrode.

Figure 9B:
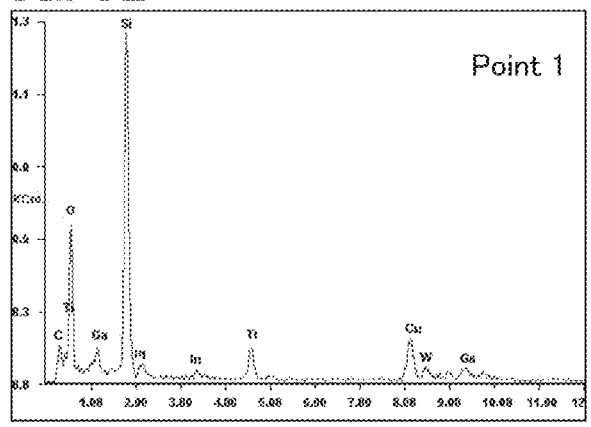
Figure 9C:
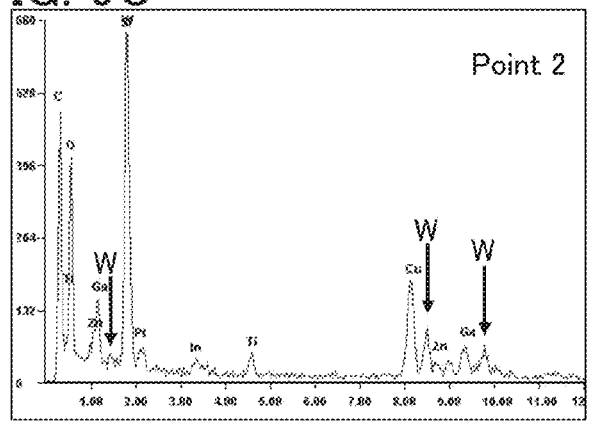

Elemental analyses with the use of energy dispersive X-ray spectroscopy (EDX) were conducted at the two points (Point 1 and Point 2) surrounded by dashed lines in FIG. 9A, and the results are shown in FIGS. 9B and 9C. Here, Point 1 corresponds to a region inside the silicon oxynitride film serving as a gate insulating layer, and Point 2 corresponds to a region including the side surface of the gate insulating layer and the adjacent covering layer.

As shown in FIG. 9B, silicon and oxygen were mainly detected from the region inside the gate insulating layer (Point 1). In the region near the side surface of the gate insulating layer (Point 2), large amounts of tungsten and carbon in addition to silicon and oxygen were detected. Tungsten is a metal element constituting the source electrode and the drain electrode. Carbon is an element contained in the resist material. Accordingly, it is understood that the covering layer on the side surface of the gate insulating layer was formed in the following manner: part of the resist and part of the upper portion of the source and drain electrodes were etched when the second oxide layer was formed by etching, and the reaction products of these attached to the side surface of the gate insulating layer.

Figure 10A:
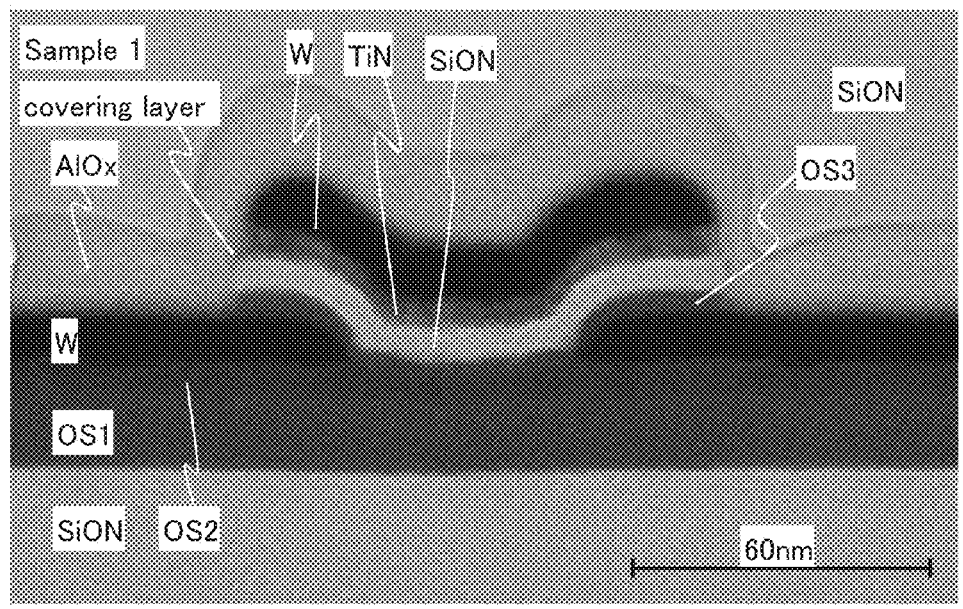
FIGS. 10A and 10B are cross-sectional observation images of samples of examples.
Figure 10B:
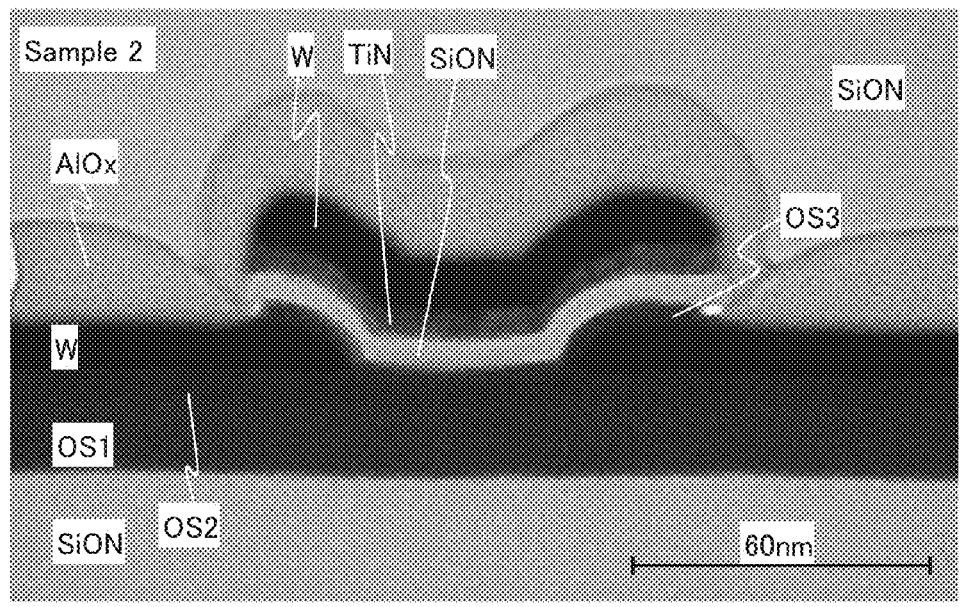

Cross-sectional observation images of Sample 1 and Sample 2 are shown in FIGS. 10A and 10B, respectively. FIGS. 10A and 10B each are phase contrast images.

From the cross-sectional observation image shown in FIG. 10A, it was found in Sample 1 that the aluminum oxide film serving as a first layer of the insulating layer does not have a low-density region or disconnection at steps at the edges of the gate electrode, gate insulating layer and second oxide layer over the pair of electrodes, and that the aluminum oxide film reliably covers such steps.

Here, although the covering layer (first covering layer) was clearly found in the cross-sectional observation image of Sample 3 (FIG. 9A), the brightness (contrast) of a covering layer (second covering layer) in the cross-sectional observation image of Sample 1 (FIG. 10A) is different from that of Sample 3 and is as bright as the aluminum oxide film and the like. A phase contrast image is an image formed according to electrons that transmit a sample. Thus, the smaller amount of electrons a film absorbs, the brighter the film looks in a phase contrast image. For example, when the film contains as its constituent element a large amount of an element with a small number of atoms or the film is low in density, the film looks bright in the phase contrast image. Accordingly, it can be understood that the covering layer was oxidized in formation of the aluminum oxide film or the like, and its density decreased.

From the cross-sectional observation image shown in FIG. 10B, it was found in Sample 2 that at least the edge of the second oxide layer is positioned on an inner side than the edge of the gate electrode. Furthermore, at the step at the edges of the gate electrode, gate insulating layer and second oxide layer over the pair of electrodes, formation of a low-density region (also referred to as a cavity) in the aluminum oxide film, which is the first layer of the insulating layer, was seen. In addition, formation of a cavity was also seen between the edge of the second oxide layer and the aluminum oxide film. The cause of this is presumed to be as follows. That is, at least the edge of the second oxide layer receded by etching when the covering layer was removed by etching, and an undercut was formed, which led to the decrease in coverage with the insulating layer to be formed thereover. In this way, when a low-density region is formed in the insulating layer serving as a protective film, its barrier property against impurities such as water and hydrogen deteriorates, and the reliability may decrease.

<Measurement of Electrical Characteristics>

Next, electrical characteristics of the manufactured transistors Sample 1 and Sample 2 were measured. Here, change in characteristics of current flowing between a source and a drain (hereinafter also referred to as drain current $I_d$) were measured under the conditions where the potential difference between the source and the drain (hereinafter also referred to as drain voltage $V_d$) was 0.1 V or 1.0 V, and the potential difference between the source and the gate (hereinafter also referred to as gate voltage $V_g$) was changed from −3.0 V to 3.0 V. That is, $V_g$-$I_d$ characteristics were measured.

Here, as an example, nine transistors of L/W=100 nm/1000 nm and 25 transistors of L/W=50 nm/100 nm were used for the measurement with respect to each of Sample 1 and Sample 2, the results of which were as follows. Note that L stands for the channel length and W stands for the channel width.

Figure 11A:
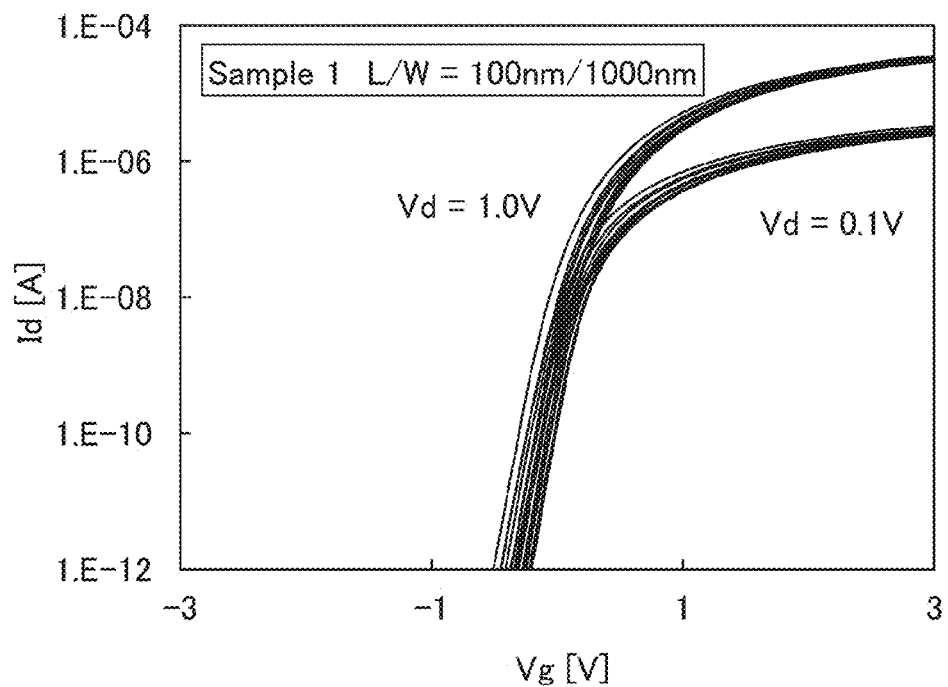
FIGS. 11A and 11B are $V_g$-$I_d$ characteristics of samples of examples.
Figure 11B:
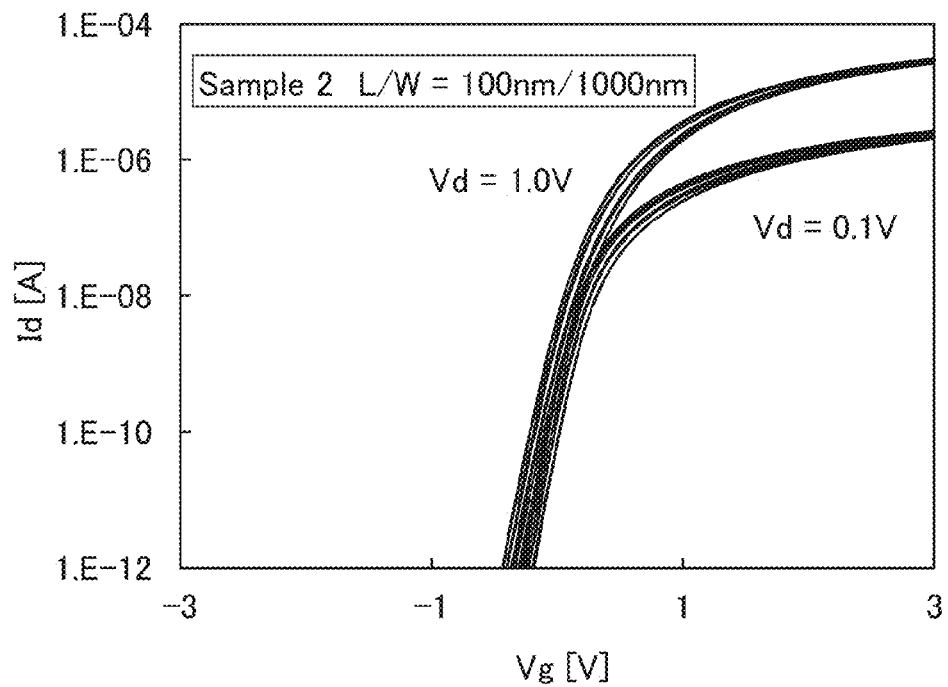
Figure 12A:
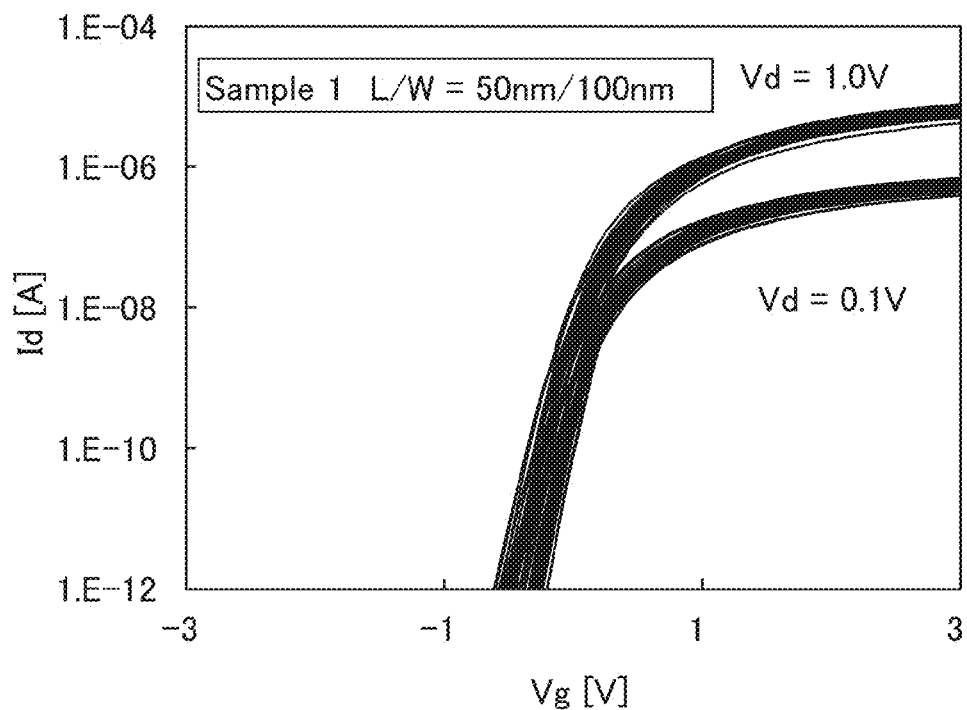
FIGS. 12A and 12B are $V_g$-$I_d$ characteristics of samples of examples.
Figure 12B:
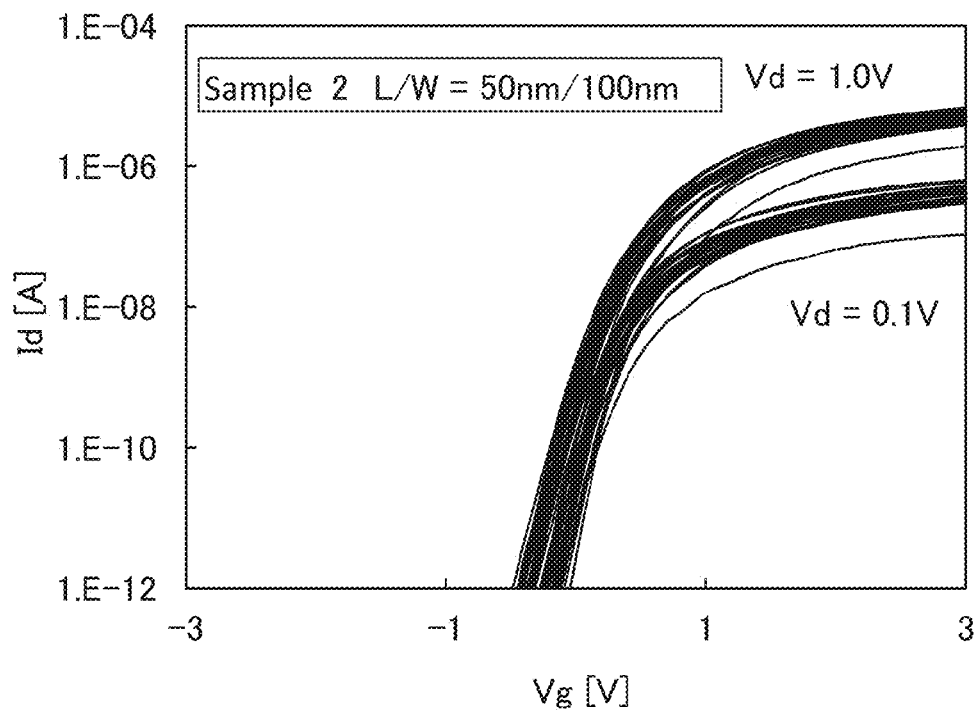

FIGS. 11A and 11B respectively show $V_g$-$I_d$ characteristics of Sample 1 and Sample 2, which are transistors of L/W=100 nm/1000 nm. FIGS. 12A and 12B respectively show $V_g$-$I_d$ characteristics of Sample 1 and Sample 2, which are transistors of L/W=50 nm/100 nm.

FIGS. 11A and 11B demonstrated that equivalent electrical characteristics were obtained from Sample 1 and Sample 2 as their initial characteristics. Furthermore, FIGS. 12A and 12B demonstrated that equivalent electrical characteristics were obtained from Sample 1 and Sample 2 as their initial characteristics even for transistors with extremely small channel length L and channel width W. Accordingly, it was verified that the gate electrode and the source and drain electrodes were reliably insulated from each other without being short-circuited via the covering layer in Sample 1.

The above cross-sectional observation images and measurement results of electrical characteristics demonstrated that the transistor manufactured by the manufacturing method of a semiconductor device according to one embodiment of the present invention was a highly reliable transistor in which the coverage with an insulating layer covering the transistor was improved. Furthermore, it was verified that a transistor manufactured extremely minutely also had favorable electrical characteristics.

This application is based on Japanese Patent Application serial no. 2013-123013 filed with Japan Patent Office on Jun. 11, 2013, the entire contents of which are hereby incorporated by reference.

What is claimed is:

1. A method for manufacturing a semiconductor device, comprising:
    forming an oxide semiconductor layer over an insulating surface;
    forming a source electrode and a drain electrode over the oxide semiconductor layer, the source and drain electrodes comprising an element;
    forming an insulating film over the oxide semiconductor layer, the source electrode, and the drain electrode;
    forming a conductive film over the insulating film;
    etching part of the conductive film and part of the insulating film to form a gate electrode and a gate insulating layer,
    forming a first covering layer which comprises the element, by etching part of an upper portion of the source electrode and part of an upper portion of the drain electrode;
    wherein the first covering layer is in contact with a side surface of the gate insulating layer and the etched part of the upper portion of the source electrode and the etched part of the upper portion of the drain electrode; and
    oxidizing the first covering layer to form a second covering layer.

2. The method for manufacturing the semiconductor device according to claim 1, further comprising:
    forming a protective insulating layer comprising an oxide over the second covering layer.

3. The method for manufacturing the semiconductor device according to claim 2,
    wherein the first covering layer is oxidized to form the second covering layer in forming the protective insulating layer.

4. The method for manufacturing the semiconductor device according to claim 2,
    wherein the first covering layer is oxidized to form the second covering layer in forming the protective insulating layer.

5. The method for fabricating the semiconductor device according to claim 2, wherein the protective insulating layer comprises an aluminum oxide.

6. The method for manufacturing the semiconductor device according to claim 1, further comprising:
    forming a first oxide layer over the insulating surface before forming the oxide semiconductor layer;
    forming an oxide film over the source electrode and the drain electrode before forming the insulating film,
    wherein part of the oxide film is etched to form a second oxide layer in etching the part of the conductive film and the part of the insulating film so that the first covering layer is in contact with a side surface of the second oxide layer.

7. The method for manufacturing the semiconductor device according to claim 1,
    wherein the element is one selected from the group consisting of aluminum, titanium, chromium, nickel, copper, yttrium, zirconium, molybdenum, silver, tantalum, and tungsten.

8. The method for fabricating the semiconductor device according to claim 1, wherein the oxide semiconductor layer comprises indium and zinc.

9. A semiconductor device comprising:
    an oxide semiconductor layer over an insulating surface;
    a source electrode and a drain electrode over the oxide semiconductor layer, each of the source electrode and the drain electrode comprising an element;
    a gate insulating layer over the oxide semiconductor layer;
    a gate electrode over the gate insulating layer, an end portion of the source electrode and an end portion of the drain electrode,
    a covering layer which comprises an oxide comprising the element, and is in contact with a side surface of the gate insulating layer; and a protective insulating layer covering the covering layer, the source electrode and the drain electrode, and comprising an oxide, wherein a top-view shape of the gate electrode and a top-view shape of the gate insulating layer are substantially the same.

10. The semiconductor device according to claim 9, wherein the protective insulating layer comprises an aluminum oxide.

11. The semiconductor device according to claim 9, wherein the element is one selected from the group consisting of aluminum, titanium, chromium, nickel, copper, yttrium, zirconium, molybdenum, silver, tantalum, and tungsten.

12. A semiconductor device according to claim 9, further comprising:
a first oxide layer over the insulating surface; and
a second oxide layer over the oxide semiconductor layer;
wherein the oxide semiconductor layer is over the first oxide layer,
wherein the source electrode and the drain electrode are over the second oxide layer, and
wherein the gate insulating layer is over the second oxide layer.

13. The semiconductor device according to claim 9, wherein the oxide semiconductor layer comprises indium and zinc.

14. The semiconductor device according to claim 9, wherein the protective insulating layer is in direct contact with a top surface of the source electrode and a top surface of the drain electrode.

15. A semiconductor device comprising:
a first oxide layer over an insulating surface;
an oxide semiconductor layer over the first oxide layer;
a source electrode and a drain electrode over the oxide semiconductor layer, each of the source electrode and the drain electrode comprising an element;
a second oxide layer over the oxide semiconductor layer;
a gate insulating layer over the second oxide layer;
a gate electrode over the gate insulating layer;
a covering layer which comprises an oxide comprising the element, and is in contact with a side surface of the gate insulating layer and a side surface of the second oxide layer; and
a protective insulating layer covering the covering layer, the source electrode and the drain electrode, and comprising an oxide,
wherein a top-view shape of the gate electrode, a top-view shape of the gate insulating layer, and a top-view shape of the second oxide layer are substantially the same, and
wherein the protective insulating layer is in direct contact with the insulating surface and a top surface of the source electrode.

16. The semiconductor device according to claim 15, wherein the protective insulating layer comprises an aluminum oxide.

17. The semiconductor device according to claim 15, wherein the element is one selected from the group consisting of aluminum, titanium, chromium, nickel, copper, yttrium, zirconium, molybdenum, silver, tantalum, and tungsten.

18. The semiconductor device according to claim 15, wherein the oxide semiconductor layer comprises indium and zinc.

19. The semiconductor device according to claim 15, wherein the gate insulating layer is over the source electrode and the drain electrode.

* * * * *